(12) United States Patent
Nicolson et al.

(10) Patent No.: US 12,261,930 B1
(45) Date of Patent: Mar. 25, 2025

(54) LOCAL OSCILLATOR (LO) AND REFERENCE CLOCK SIGNAL DISTRIBUTION

(71) Applicant: Amazon Technologies, Inc., Seattle, WA (US)

(72) Inventors: Sean Timothy Nicolson, Bellevue, WA (US); Joung Won Park, Sammamish, WA (US); Satwik Patnaik, Tampa, FL (US)

(73) Assignee: Amazon Technologies, Inc., Seattle, WA (US)

( * ) Notice: Subject to any disclaimer, the term of this patent is extended or adjusted under 35 U.S.C. 154(b) by 476 days.

(21) Appl. No.: 17/734,888

(22) Filed: May 2, 2022

(51) Int. Cl.
*H04L 7/00* (2006.01)
*H04L 7/033* (2006.01)

(52) U.S. Cl.
CPC ............ *H04L 7/0091* (2013.01); *H04L 7/033* (2013.01)

(58) Field of Classification Search
CPC .............................. H04L 7/0091; H04L 7/033
USPC ......................................................... 375/307
See application file for complete search history.

(56) References Cited

U.S. PATENT DOCUMENTS 10,541,742 B1 * 1/2020 Andrade ................ H04B 1/006

* cited by examiner

*Primary Examiner* — Fitwi Y Hailegiorgis
(74) *Attorney, Agent, or Firm* — Lowenstein Sandler LLP

(57) ABSTRACT

Technologies directed to the distribution of local oscillator (LO) signals and reference clock signals to beamforming circuits of a panel with an array of antenna elements are described. A communication system includes antenna elements, beamforming circuits, driver circuitry, and diplexing circuitry with signal paths between the diplexing circuitry and the beamforming circuits. The driver circuitry outputs a first signal having a first frequency and a second signal having a second frequency lower than the first frequency. The diplexing circuitry generates a combined signal comprising the first and second signals and sends the combined signal to each beamforming circuit.

20 Claims, 14 Drawing Sheets

US 12,261,930 B1

LOCAL OSCILLATOR (LO) AND REFERENCE CLOCK SIGNAL DISTRIBUTION

BACKGROUND

A large and growing population of users is enjoying entertainment through the consumption of digital media items, such as music, movies, images, electronic books, and so on. The users employ various electronic devices to consume such media items. Electronic devices (referred to herein as endpoint devices, user devices, clients, client devices, or user equipment) are book readers, cellular telephones, Personal Digital Assistants (PDAs), portable media players, tablet computers, netbooks, laptops, and the like. These electronic devices wirelessly communicate with a communications infrastructure to enable the consumption of digital media items. In order to communicate with other devices wirelessly, these electronic devices include one or more antennas.

DETAILED DESCRIPTION

Technologies directed to the distribution of LO signals and reference clock signals to beamforming circuits of a panel with an array of antenna elements are described. An array of antenna elements, such as a phased array antenna, can include hundreds or thousands of antenna elements. The antenna elements can be arranged in antenna modules for applications in large array antennas, such as a phased array antenna. The panel can be a communication unit made up of antenna modules, or simply modules, that include a subset of antenna elements, with the subset containing one to tens of antenna elements. The modules can be individually manufactured and assembled as an array antenna. Each module can be associated with or include a beamforming circuit, such as a digital beamforming (DBF) device coupled to front-end radio frequency (RFFE) circuitry and one or more antenna elements. As described above, each beamforming circuit uses LO signals and reference clock signals for radio frequency (RF) and baseband signal processing. Conventionally, either each beamforming circuit includes its own phase-locked loop (PLL) circuit, or a dedicated, centralized PLL circuit can provide a common LO signal and reference clock signals to all beamforming circuits on the panel. The dedicated, centralized PLL circuit increases the number of signal lines between the PLL circuit and the beamforming circuits, resulting in crowded routing, especially around the PLL circuit.

Aspects of the present disclosure and embodiments overcome these deficiencies and others by sharing routing lines between LO signals and reference clock signals. Aspects of the present disclosure and embodiments can use a diplexer to combine two RF signals, including a low-frequency clock reference signal ($<\sim$150 MHz) and a high-frequency LO signal ($>\sim$9-10 GHz). The combining and splitting can be achieved by an on-chip transformer with a center tap. In addition, the reference clock signals can be sent in common mode, and the LO signals can be sent in differential mode on the same PCB lines to further isolate both signals from each other.

In at least one embodiment, a communication system includes antenna elements, beamforming circuits, driver circuitry, and diplexing circuitry with signal paths between the diplexing circuitry and the beamforming circuits. The driver circuitry drives a first signal having a first frequency and a second signal having a second frequency lower than the first frequency. The diplexing circuitry generates a combined signal comprising the first and second signals and sends the combined signal to each beamforming circuit.

Figure 1A:
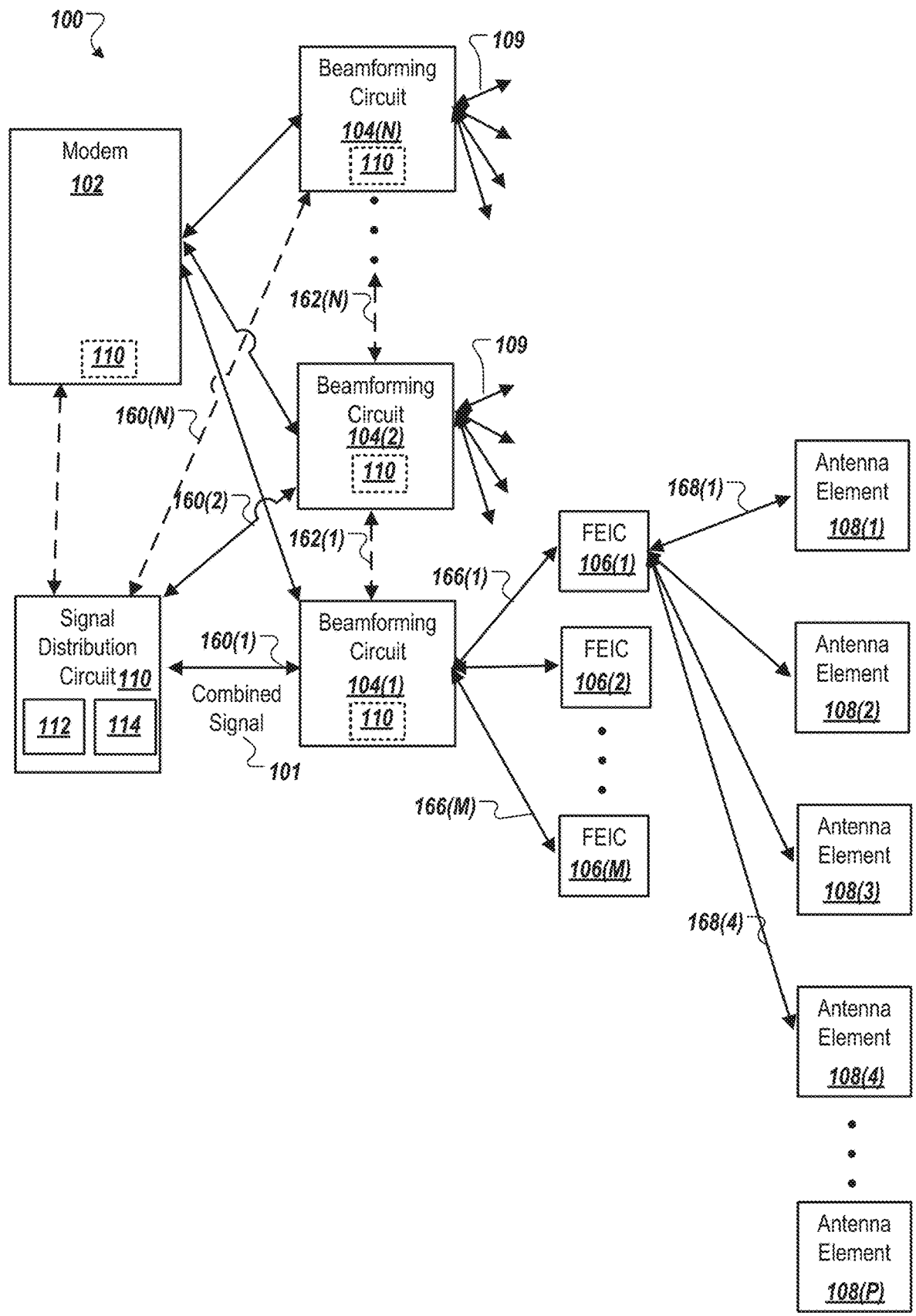
FIG. 1A is a block diagram of a panel with a signal distribution circuit for distributing a combined signal to multiple beamforming circuits, according to at least one embodiment.

FIG. 1A is a block diagram of a panel 100 with a signal distribution circuit 110 for distributing a combined signal 101 to multiple beamforming circuits 104(1)-(N), according to at least one embodiment. The panel 100 includes signal distribution circuit 110, a modem 102, the multiple beamforming circuits 104(1)-(N), multiple front-end integrated circuits (FEICs) 106(1)-(M), and multiple antenna elements 108(1)-(P), wherein N, M, and P are positive integers. In other embodiments, multiple signal distribution circuits can be used to provide signaling to the various beamforming circuits 104(1)-(N).

As illustrated in FIG. 1A, the signal distribution circuit 110 is coupled to a first beamforming circuit 104(1) over a first signal path 160(1). The signal distribution circuit 110 can send a combined signal 101 over the first signal path 160(1) to the first beamforming circuit 104(1). The combined signal 101 can include an LO signal with a first frequency and a reference clock with a second frequency less than the first frequency. Additional details of the combined signal 101 are described below. The signal paths can include one conductive path (for single-ended signaling) or two conductive paths (for differential signaling). The signal distribution circuit 110 is coupled to a second beamforming circuit 104(2) over a second signal path 160(2). The signal distribution circuit 110 is coupled to an Nth beamforming circuit 104(N) over an Nth signal path 160(N). In another embodiment, the first beamforming circuit 104(1) is coupled to the second beamforming circuit 104(2) over a second signal path 162(1). The signal distribution circuit 110 can send the combined signal 101 (or a copy of the combined signal 101) over the second signal path 160(2) to the second beamforming circuit 104(2). The second beamforming circuit 104(2) can be coupled to one or more additional beamforming circuits 104(N) over one or more additional signal paths 162(N). The signal distribution circuit 110 can send the combined signal 101 (or a copy of the combined signal 101) over the one or more additional signal paths 162(N) to the one or more additional beamforming circuits 104(N). The signal distribution circuit 110 can also send the combined signal 101 to the modem 102. In another embodiment, the modem 102 can include the signal distribution circuit 110 that generates and send the combined signal 101 to the beamforming circuits 104(1)-(N).

Each beamforming circuit 104 can be coupled to one or more FEICs 106. For example, as illustrated in FIG. 1A, the first beamforming circuit 104(1) is coupled to the M number of FEICs 106(1)-156(M), where M is a positive integer. For example, each beamforming circuit 104 can be coupled to nine FEICs 106. The beamforming circuit 104 can be coupled to the FEIC 106 over a wired connection 166, such as a circuit board trace or a transmission line between the beamforming circuit 104 and the FEIC 106. Each FEIC 106 can be coupled to one or more antenna elements 108. For example, the first FEIC 106(1) is coupled to four antenna elements 108(1)-108(4). The FEIC 106 can be coupled to the antenna element 108 over a wired connection 168, such as a circuit board trace or a transmission line between the FEIC 106 and the antenna element 108. Alternatively, the first FEIC 106(1) can be coupled to more or fewer antenna elements than four.

In at least one embodiment, the beamforming circuits 104(1)-(N) are digital beamforming (DBF) devices. The first beamforming circuit 104(1) is considered a modem entry in the illustrated embodiment. A modem entry is a beamforming circuit that connects to one or more modems of the panel. The modem entry is an ingress and egress for data signals and control signals to and from a modem to which it is connected (i.e., modem 102 in the illustrated embodiment). The beamforming circuits 104(1)-(N) are analog in at least one embodiment. In at least one embodiment, the beamforming circuits 104(1)-(N) are hybrid beamforming circuits with digital and analog components.

In one embodiment, a first set of antenna elements is coupled to a first RFFE circuit (e.g., FEIC 106(1)) of a first set of RFFE circuits coupled to the first beamforming circuit 104(1). A second set of antenna elements is coupled to a second RFFE circuit of the first set. A third set of antenna elements is coupled to a first RFFE circuit of the second set of RFFE circuits (e.g., FEIC 106(1)-(M). It should be noted that in another embodiment, the beamforming circuits can couple directly to the antenna elements without the RFFE circuits. Some or all of the functionality of the set of RFFE circuits can be implemented in the beamforming circuits. The beamforming circuits 104 can be part of a TX panel. In the TX panel, the first beamforming circuit 104(1) is configured to receive a first data stream from modem 102, send the first data stream to the second beamforming circuit 104(2), and send at least a portion of the first data stream to the first set of RFFE circuits. In another embodiment, the beamforming circuits 104 can be part of an RX panel. In the RX panel, the first beamforming circuit 104(1) is configured to receive a first data stream from the first set of RFFE circuits, receive a second data stream from the second beamforming circuit 104(2), and send a combined data stream to the modem 102. The combined data stream includes at least a portion of the first data stream and at least a portion of the second data stream with matching timestamps.

In another embodiment, the first beamforming circuit 104(1) includes a digital signal processing (DSP) unit and a memory device coupled to the DSP unit. The DSP unit is configured to receive a first data stream from the first set of RFFE circuits, process the first data stream, and store the first data stream with the first timestamp data in the memory device. The DSP unit receives a second data stream from the second set of RFFE circuits, process the second data stream, and store the second data stream with the second timestamp data in the memory device. The DSP unit combines a portion of the first data stream and a portion of the second data stream into a combined data stream and outputs the combined data stream to modem 102 over a data signal path (not illustrated in FIG. 1A). In another embodiment, the DSP unit is configured to receive a data stream from the modem 102 and split the data stream into multiple signals, each signal being directed to one of the FEICs 106(1)-(M).

In at least one embodiment, the signal distribution circuit 110 includes driver circuitry 112 and diplexing circuitry 114. The signal distribution circuit 110 is coupled to the multiple signal paths 160(1)-(N), each being coupled to one of the beamforming circuits 104(1)-(N). The driver circuitry 112 drives a first signal and a second signal. The first signal can be a LO signal with a first frequency, and the second signal can be a reference clock signal with a second frequency lower than the first frequency. The driver circuitry 112 can include two separate drivers coupled to two different signal sources, such as a first signal generator and a second signal generator. For example, the first signal generator is a first PLL circuit and the second signal generator is a second PLL circuit. In other embodiment, the signal generators can be other types of signal sources, such as a crystal oscillator (XO), a delay-locked loop (DLL) circuit, a ring oscillator, or the like. The diplexing circuitry 114 receives the first and second signals from driver circuitry 112. The diplexing circuitry 114 generates a combined signal 101 with the first signal and the second signal and sends the combined signal 101 to at least the first beamforming circuit 104(1). The diplexing circuitry 114 can send the combined signal 101 (or a copy of the combined signal 101) to each of the other beamforming circuits 104(2)-(N).

It should be noted that FIG. 1A does not illustrate additional data and control signal paths between the modem 102 and the beamforming circuits 104. FIG. 1A is intended to show the single signal paths for sending the combined signal 101 to the beamforming circuits 104 instead of sending separate LO and reference clock signals on separate signal paths to the beamforming circuits 104 as done conventionally. It should also be noted that the signal distribution circuit 110 can be used in other locations, such as illustrated at each of the beamforming circuits 104(1)-(N) with dashed boxes. Additional details of the signal distribution circuit 110 at the first beamforming circuit 104(1) are described below regarding FIG. 1B.

Figure 1B:
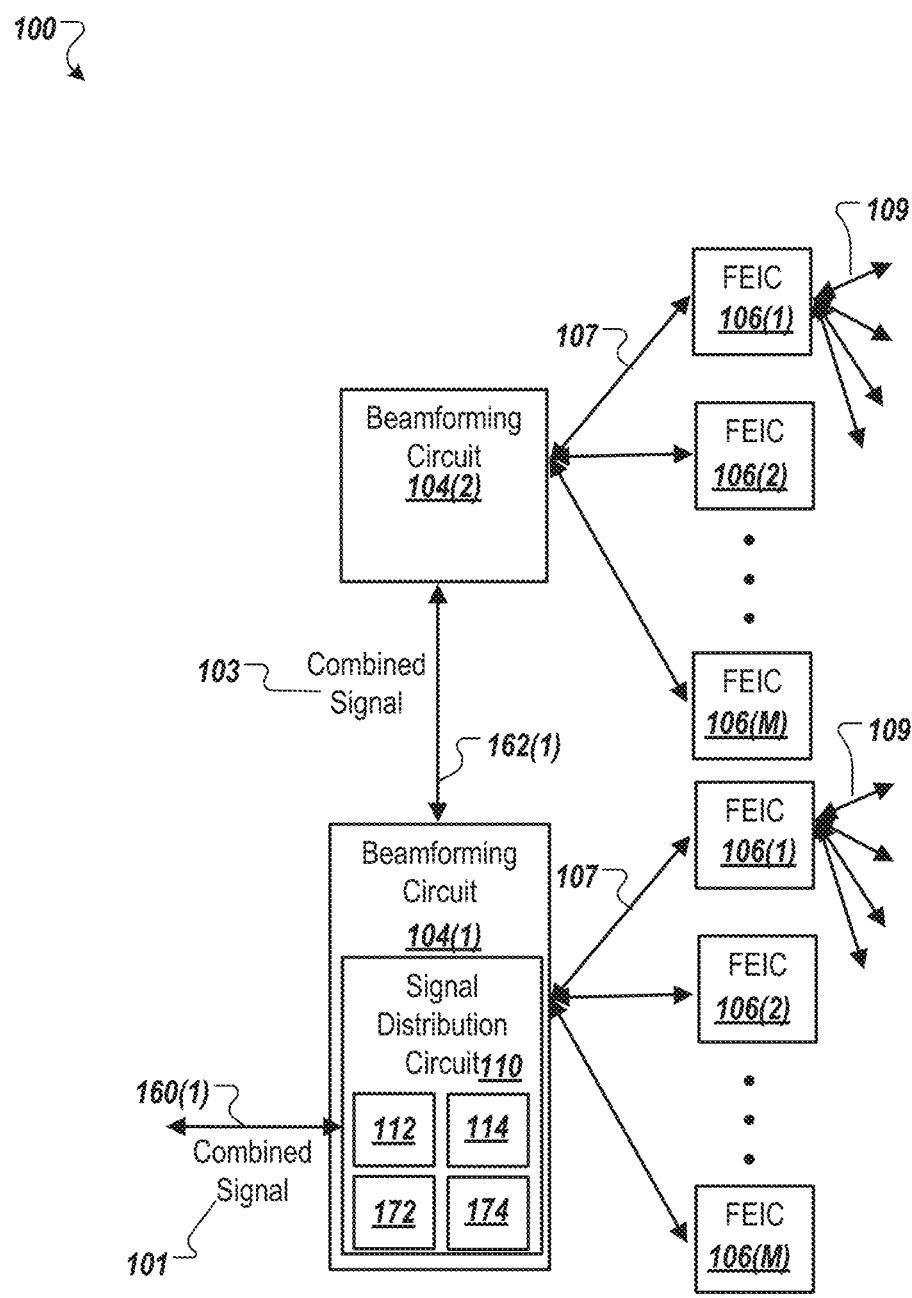
FIG. 1B is a block diagram of a beamforming circuit with a signal distribution circuit for receiving a combined signal and distributing a combined signal to multiple beamforming circuits, according to at least one embodiment.

FIG. 1B is a block diagram of a first beamforming circuit 104(1) with a signal distribution circuit 110 for receiving a combined signal 101 and distributing a combined signal 103 to multiple beamforming circuits, according to at least one embodiment. In this embodiment, the signal distribution circuit 110 includes the driver circuitry 112 and diplexing circuitry 114 described above. The signal distribution circuit 110 does not include the first signal source and the second signal source, as described above with respect to FIG. 1A. The signal distribution circuit 110 of the first beamforming circuit 104(1) also includes second diplexing circuitry 172 and buffer circuitry 174. The second diplexing circuitry 172 is coupled to the first signal path 160(1) to receive the combined signal 101 from another device, such as signal distribution circuit 110 or another beamforming circuit. As described above, the combined signal 101 includes the first and second signals. The second diplexing circuitry 172 can generate a copy of the first signal and a copy of the second signal from the received combined signal 101. The buffer circuitry 174 can include a first buffer for the first signal and a second buffer for the second signal. The buffer circuitry 174 can drive the first and second signals to the diplexing circuitry 114 instead of the driver circuitry 112. The first beamforming circuit 104(1) can use the copy of the first signal and the copy of the second signal. The first beamforming circuit 104(1) can also forward the first signal and the second signal to a second beamforming circuit 104(2) using the driver circuitry 112 (or the buffer circuitry 174) and the diplexing circuitry 114, as described above.

In another embodiment, the second diplexing circuitry 172 can be coupled to a signal path coupled to signal distribution circuit 110 or another beamforming circuit. The second diplexing circuitry 172 can receive a second combined signal over the signal path and generates the first and second signals from the second combined signal. The buffer circuitry 174 can receive the first and second signals from the second diplexing circuitry 172. The buffer circuitry 174 can drive the signals locally or be combined and forwarded to another beamforming circuitry.

In at least one embodiment, the driver circuitry 112 includes a set of drivers for each of the signal paths 160(1)-(N). For example, the driver circuitry 112 includes, for a first signal path 160(1), a first driver coupled to a first signal generator and a second driver coupled to a second signal generator. The first driver drives a first copy of the first signal, and the second driver drives a first copy of the second signal. The driver circuitry 112 includes, for a second signal path 160(2), a third driver coupled to the first signal generator, and a fourth driver coupled to the second signal generator. The third driver drives a second copy of the first signal, and the fourth driver drives a second copy of the second signal. Continuing with this example, the diplexing circuitry 114 includes a first diplexer for the first signal path 160(1) and a second diplexer for the second signal path 160(2). The first diplexer is coupled to the first driver and the second driver. The first driver sends a first copy of the combined signal 101 over the first signal path 160(1) to the first beamforming circuit 104(1). The second diplexer is coupled to the third driver and the fourth driver. The second diplexer sends a second copy of the combined signal 101 over the second signal path 160(2) to the second beamforming circuit 104(2).

In at least one embodiment, the first driver (and the third driver) is a differential driver that drives the first signal as a first differential signal. The second driver (and the fourth driver) can be an inverter that drives the second signal as a single-ended signal. Additional details of the driver circuitry 112 and diplexing circuitry 114 are described below with respect to FIGS. 3A-3B. The driver circuitry 112 and diplexing circuitry 114 can be used to reduce the signal paths between beamforming circuits and centralized PLL circuit (s), such as described below with respect to FIGS. 2A-2B.

Figure 2A:
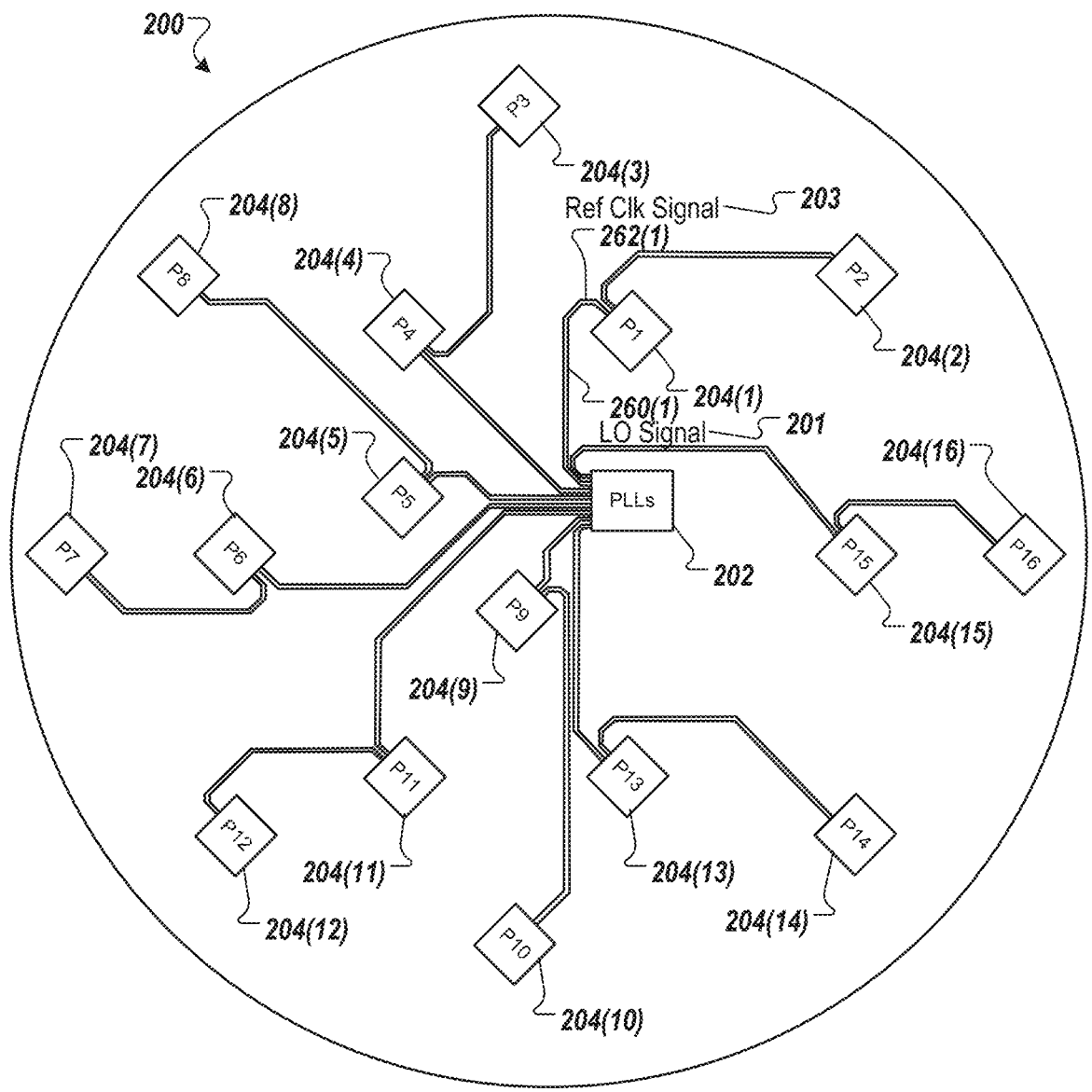
FIG. 2A illustrates a panel with multiple signal paths between beamforming circuits and multiple PLL circuits, according to at least one embodiment.

FIG. 2A illustrates a panel 200 with multiple signal paths between beamforming circuits 204 and multiple PLL circuits 202, according to at least one embodiment. The beamforming circuits 204(1)-(16) each use a common LO signal 201 and a reference clock signal 203 for RF and baseband signal processing. In this embodiment, the multiple PLL circuits 202 include a first PLL circuit that generates the LO signal 201 and a second PLL circuit that generates the reference clock signal 203. In at least one embodiment, the first PLL and the second PLL are part of the same integrated circuit (e.g., PLL chip) that produces both the LO signal 201 and the reference clock signal 203. The LO signal 201 can be common to all beamforming circuits 204(1)-(16) on the panel 200.

As illustrated in FIG. 2A, there are two separate signal paths 206, 262 between the PLL circuits 202 and the respective beamforming circuit 204. For example, the PLL circuits 202 provide the LO signal 201 to the first beamforming circuit 204(1) using a first signal path 260(1). The PLL circuits 202 provide the reference clock signal 203 to the first beamforming circuit 204(1) using a second signal path 262(1). It should be noted that the centralized PLL circuits 202 save chip area on the respective beamforming circuits 204(1)-(16), yet increases a number of routing lines between the centralized PLL circuits 202 and the beamforming circuits 204(1)-(16). For example, since there are sixteen beamforming circuits 204(1)-(16) on the panel 200, thirty-two signal paths (e.g., 260(1)-(16) and 262(1)-(16)) are needed for distributing the LO signal 201 and the reference clock signal 203 to the beamforming circuits 204(1)-(16). The number of signal lines increases as the number of beamforming circuits increases on a panel. This can congest the routing lines and require complex routing patterns to accommodate the increased signal lines, especially closer to the PLL circuits 202. Additional PCB layers may be needed for more complex routing of these multiple signal lines, increasing the design cost. Aspects of the present disclosure and embodiments overcome these deficiencies and others by sharing routing lines between LO signals and reference clock signals, as described below with respect to FIG. 2B.

Figure 2B:
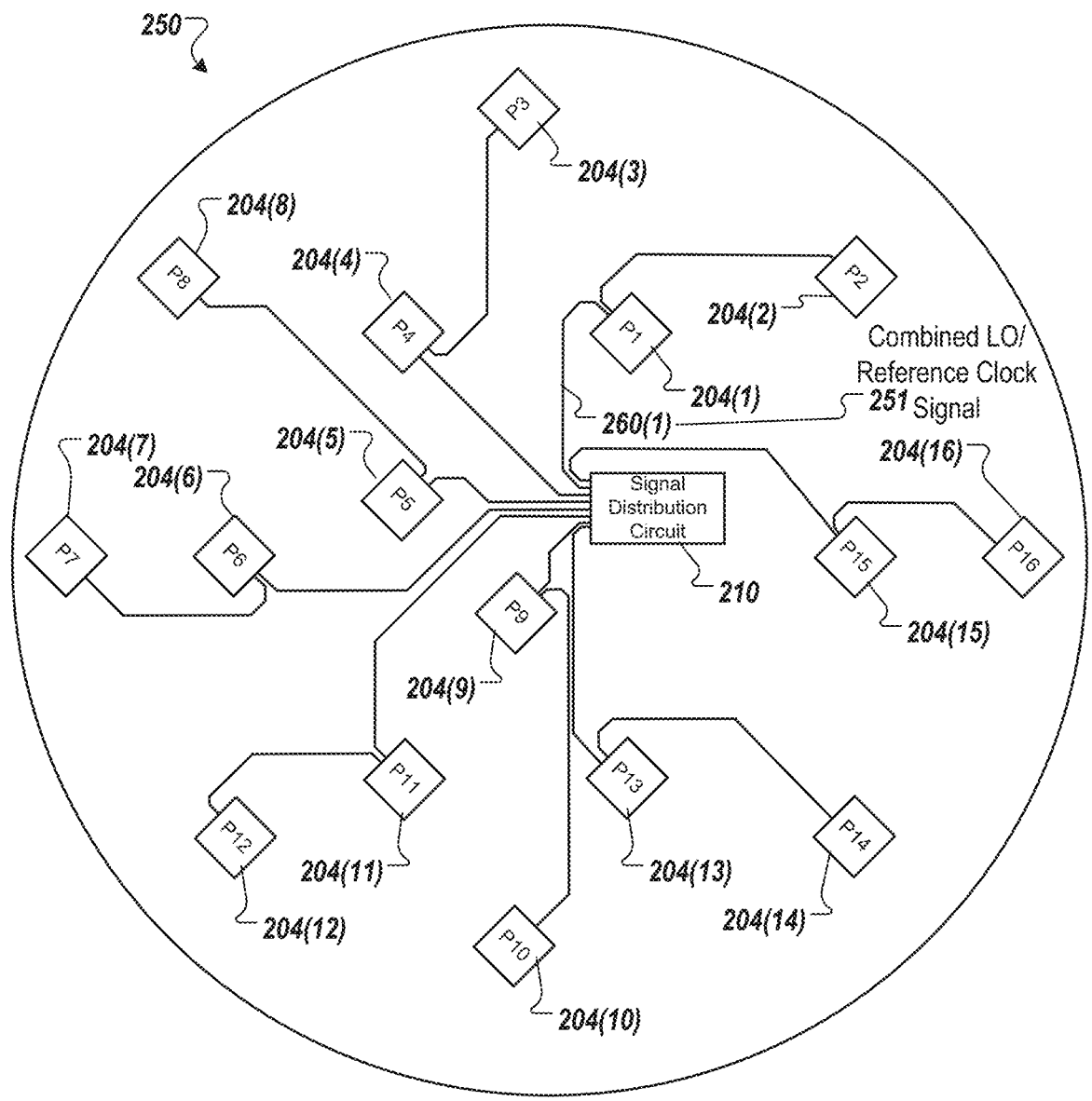
FIG. 2B illustrates a panel with a single signal path between beamforming circuits and a signal distribution circuit, according to at least one embodiment.

FIG. 2B illustrates a panel 250 with a single signal path 260 between beamforming circuits 204 and a signal distribution circuit 210, according to at least one embodiment. In this embodiment, the signal distribution circuit 210 can be used in connection with multiple PLLs described above. For example, the PLL circuits (not illustrated in FIG. 2B)

provide the LO signal and the reference clock signal to the signal distribution circuit 210. The signal distribution circuit 210 provides a combined signal 251, which includes the LO signal and the reference clock signal, to the first beamforming circuit 204(1) using a single signal path 260(1) coupled between the first beamforming circuit 204(1) and the signal distribution circuit 210. It should be noted that the single signal path 260(1) can be a differential pair of conductive traces or a single conductive trace. It should be noted that the centralized PLL circuits and signal distribution circuit 210 can still save on-chip area the respective beamforming circuits 204(1)-(16), yet decrease a number of routing lines between the centralized PLL circuits and signal distribution circuit 210 and the beamforming circuits 204(1)-(16). For example, since there are sixteen beamforming circuits 204(1)-(16) on the panel 200, sixteen signal paths (e.g., 260(1)-(16)) are needed for distributing the combined signal 251, which includes the LO signal and the reference clock signal, to the beamforming circuits 204(1)-(16). In this manner, the number of signal lines increases the same as the number of beamforming circuits increases on a panel. This can reduce the congestion of the routing lines and simplify routing patterns, especially closer to the centralized PLL circuits. Fewer routing lines can also reduce the number of additional PCB layers needed to route the signal lines, reducing the design cost.

As described above, routing difficulties and additional PCB costs can be avoided by sharing routing lines between the LO and reference clock signals. The sharing can be accomplished with diplexing circuitry so long as there is adequate frequency separation or filtering between the two signals to be separated at the beamforming circuits.

As illustrated in FIG. 2B, the first beamforming circuit 204(1) is coupled to a second beamforming circuit 204(2) in a chain. The first beamforming circuit 204(1) can include circuitry to send the combined signal 251 to the second beamforming circuit 204(2). The circuitry can simply re-drive the combined signal 251, in one embodiment. In another embodiment, the second beamforming circuitry 204(2) can include driver circuitry, diplexing circuitry, buffering circuitry, or the like to generate a copy of the combined signal 251 to forward to the second beamforming circuit 204(2). In other embodiments, multiple beamforming circuits can be organized in a chain from the signal distribution circuit 210 to reduce further the amount of routing lines on the panel 250.

In many RF applications, a diplexer is used to combine two RF signals. Many published diplexers combining two signals usually require high-order filtering to provide decent isolation between ports. This causes diplexers to occupy a significant area, making them hard to implement on the chip. Diplexers are mostly designed on a PCB. In these embodiments, the diplexing circuitry can combine a low-frequency signal, such as less than 150 MHz for a reference clock signal, with a high-frequency signal, such as greater than 9-10 GHz for a LO signal. The diplexing circuitry does not necessarily need high-order filtering to provide decent isolation, as described in more detail below. In other embodiments, the first signal can have a frequency that is greater than a frequency of the second signal by at least one octave. In at least one embodiment, the first frequency can be greater than 1 GHz and the second frequency can be less than 500 MHz. In at least one embodiment, the first frequency is approximately 10 GHz and the second frequency is approximately 150 MHz.

Figure 3A:
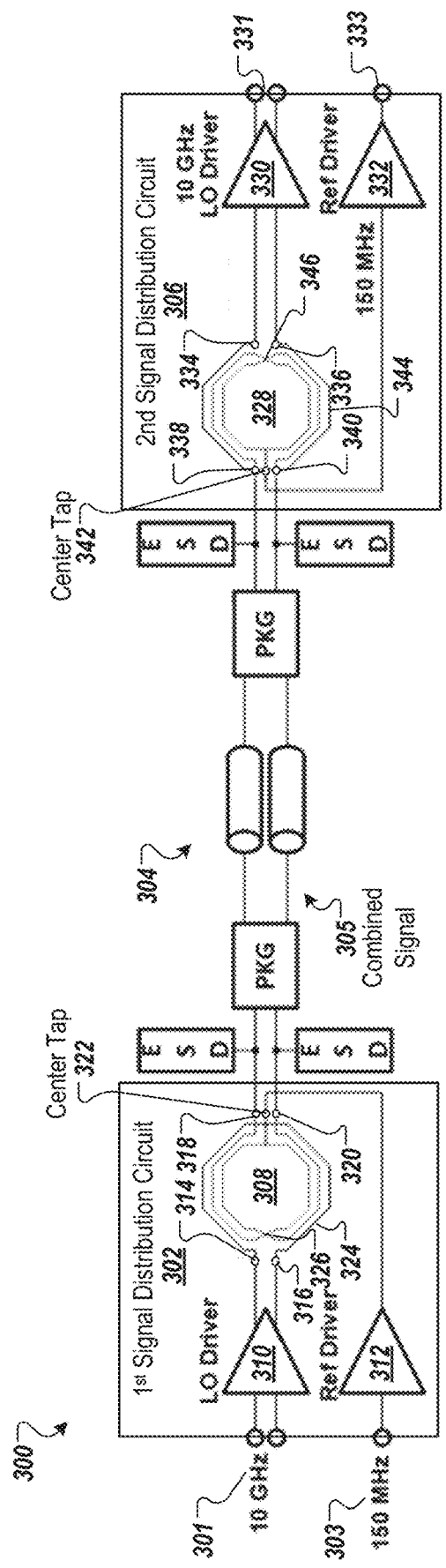
FIG. 3A is a schematic diagram of a communication system with a first signal distribution circuit, a single signal path, and a second signal distribution circuit, according to at least one embodiment.

FIG. 3A is a schematic diagram of a communication system 300 with a first signal distribution circuit 302, a single signal path 304, and a second signal distribution circuit 306, according to at least one embodiment. The first signal distribution circuit 302 includes a first diplexer 308, a first driver 310, and a second driver 312. The first signal distribution circuit 302 can be coupled to a first signal source (not illustrated in FIG. 3A) and receive a first signal 301 (e.g., 10 GHz LO signal). The first signal distribution circuit 302 can be coupled to a second signal source (not illustrated in FIG. 3A) and receive a second signal 303 (e.g., 150 MHz reference clock signal). The first diplexer 308 combines the first signal 301 and the second signal 303 to generate a combined signal 305 sent over the single signal path 304 to the second signal distribution circuit 306. The single signal path 304 can be differential signal lines used in differential signaling, as illustrated in FIG. 3A. In another embodiment, the single signal path 304 can be a single conductive trace used in single-ended signaling (not illustrated in FIG. 3A).

In at least one embodiment, the first diplexer 308 includes a first input terminal 314, a second input terminal 316, a first output terminal 318, a second output terminal 320, and a center tap 322. The first diplexer 308 includes a primary winding 324 and a secondary winding 326. The primary winding 324 is coupled between the first input terminal 314 and the second input terminal 316. The first driver 310 is coupled to the first input terminal 314 and the second input terminal 316. The first driver 310 drives the first signal 301, as a differential signal on the first input terminal 314 and the second input terminal 316. The secondary winding 326 is coupled between the first output terminal 318 and the second output terminal 320. The center tap 322 is coupled to the secondary winding 326, such as at a halfway point of the secondary winding 326. The second driver 312 is coupled to the center tap 322. The second driver 312 drives the second signal 303 on the center tap 322. The first diplexer 308 combines the first signal 301 and the second signal 303 to generate the combined signal 305. In this embodiment, the combined signal 305 is sent as a differential signal over a differential pair of signal lines for the single signal path 304. In other embodiments, the combined signal 305 can be single-ended.

In at least one embodiment, as illustrated in FIG. 3A, the primary winding 324 has one turn having a first size, and the secondary winding 326 has two turns. The secondary winding 326 can also cross over at an end opposite the halfway point. In other embodiments, the primary winding 324 includes one or more turns and the secondary winding 326 has one or more turns. The primary winding 324 and the secondary winding 326 can be implemented on one or more layers of a printed circuit board. Alternatively, other arrangements of the primary and secondary windings can be used for the first diplexer 308.

The second signal distribution circuit 306 includes a second diplexer 328, a first buffer 330, and a second buffer 332. The second signal distribution circuit 306 can be coupled to a first signal destination, such as a first circuit (not illustrated in FIG. 3A), and a second signal destination, such as a second circuit (not illustrated in FIG. 3A).

In at least one embodiment, the second diplexer 328 includes a first input terminal 334, a second input terminal 336, a first output terminal 338, a second output terminal 340, and a center tap 342. The second diplexer 328 includes a primary winding 344 and a secondary winding 346. The primary winding 344 is coupled between the first input terminal 334 and the second input terminal 336. The first buffer 330 is coupled to the first input terminal 334 and the second input terminal 336. The secondary winding 326 is coupled between the first output terminal 338 and the second output terminal 340. The center tap 342 is coupled to the secondary winding 346, such as at a halfway point of the secondary winding 346. The second buffer 332 is coupled to the center tap 342.

In at least one embodiment, as illustrated in FIG. 3A, the first diplexer 308 and the second diplexer 328 are similar. That is, the primary winding 344 has a first loop having a first size, and the secondary winding 346 has a second loop and a third loop, where the second loop has a second size that is smaller than the first size, and the third loop has a third size that is smaller than the first and second sizes. Alternatively, other arrangements of the primary and secondary windings can be used for the second diplexer 328. In other embodiments, the first diplexer 308 and the second diplexer 328 are dissimilar.

The second diplexer 328 receives the combined signal 305 via the single signal path 304 at the output terminals 338, 340. The second diplexer 328 splits the combined signal 305 into a first signal 331, corresponding to the first signal 301, and a second signal 333, corresponding to the second signal 303. The first buffer 330 receives the first signal 331 as a differential signal from the first input terminal 334 and the second input terminal 336 and drives the first signal 331 as a differential signal to the first signal destination (e.g., a first circuit). The second buffer 332 receives the second signal 333 on the center tap 342. The second buffer 332 drives the second signal 333 as a single-ended signal to the second signal destination (e.g., a second circuit). In this embodiment, the combined signal 305 is sent as a differential signal over a differential pair of signal lines for the single signal path 304. In other embodiments, the combined signal 305 can be single-ended.

As illustrated in FIG. 3A, the first signal distribution circuit 302 can be located in a semiconductor package and coupled to the single signal path 304 through packaging interconnects. Similarly, the second signal distribution circuit 306 can be located in a second semiconductor package and coupled to the single signal path 304 through packaging interconnects. The single signal path 304 can be one or two conductive traces on a circuit board. The signal path can be other types of conductors coupled between the two circuits. Electrostatic discharge circuits can be coupled to the conductive lines within the package.

As illustrated in FIG. 3A, the same PCB lines can be shared for both LO and reference clocks signals. In at least one embodiment, diplexing the low-frequency reference clock signal and the high-frequency LO signal only needs a one-pole low-pass filter or high-pass filter for isolation between the two signals. In at least one embodiment, the reference clock signal is sent or received in a common mode, and the LO signal is sent or received in a differential mode to isolate the two signals further. In at least one embodiment, the combining and splitting can be easily achieved by an on-chip transformer with a center tap. That is, in at least one embodiment, the first diplexer 308 and the second diplexer 328 can be on-chip transformers with center taps.

Figure 3B:
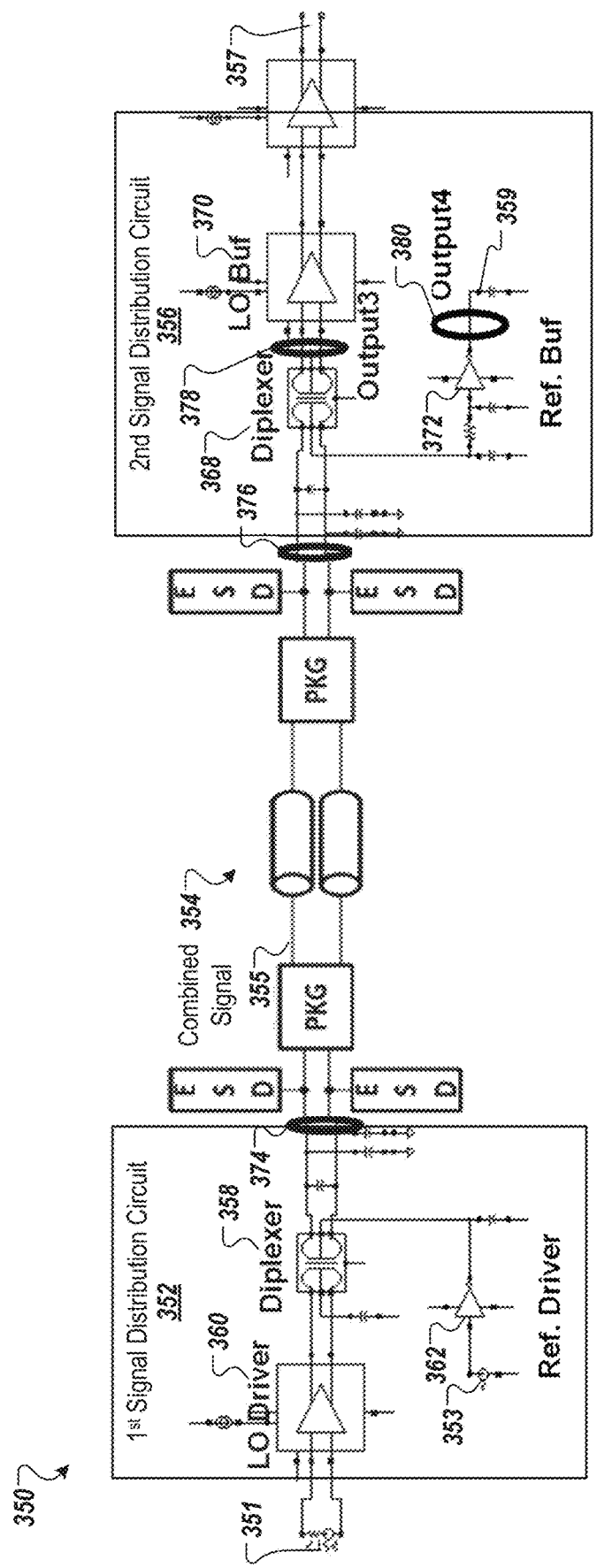
FIG. 3B is a schematic diagram of a communication system with a first signal distribution circuit, a printed circuit board (PCB) channel, and a second signal distribution circuit, according to at least one embodiment.

FIG. 3B is a schematic diagram of a communication system 350 with a first signal distribution circuit 352, a PCB channel 354, and a second signal distribution circuit 356, according to at least one embodiment. The communication system 350 is similar to the communication system 300, as noted by similar reference numbers. In the illustrated embodiment, the first signal distribution circuit 352 includes a first diplexer 358, which is a first on-chip transformer, a LO driver 360, and a reference driver 362. The LO driver 360 can be a differential driver that receives a LO signal 351 from a LO signal source (not illustrated in FIG. 3B). The LO driver 360 can be a Class B driver, a Class AB driver, or the like. The reference driver 362 can be an inverter that receives a reference clock signal 353 from a reference clock source (not illustrated in FIG. 3B). The reference driver 362 can be other types of single-ended drivers, such as a buffer, a single-ended driver, or the like. The first diplexer 358 is coupled to the LO driver 360 and the reference driver 362. In particular, the reference driver 362 is coupled to a center tap of the first diplexer 358. The first diplexer 358 receives the LO signal 351 and the reference clock signal 353. The first diplexer 358 combines the LO signal 351 and the reference clock signal 353 to generate a combined signal 355. The first diplexer 358 outputs the combined signal 355 to be sent over the PCB channel 354 to the second signal distribution circuit 356. The PCB channel 354 can be a differential signal path between the two circuits. The PCB channel 354 can be conductive traces on a circuit board. The first diplexer 358 can connect to the PCB channel 354 via package interconnects.

In the illustrated embodiment, the second signal distribution circuit 356 includes a second diplexer 368, which is a second on-chip transformer, a LO buffer 370, and a reference buffer 372. The second diplexer 368 receives the combined signal 355 over the PCB channel 354. The second diplexer 368 splits the combined signal 355 into a copy 357 of the LO signal 351 and a copy 359 of the reference clock signal 353. The LO buffer 370 can be a differential buffer that receives the copy 357 of the LO signal from the second diplexer 368. The LO buffer 370 can be a Class B buffer, a Class AB buffer, or the like. The reference buffer 372 can be an inverter that receives the copy 359 of the reference clock signal from the second diplexer 368. In particular, the reference buffer 372 is coupled to a center tap of the second diplexer 368. The LO buffer 370 can output the copy 357 of the LO signal to a first circuit (not illustrated in FIG. 3B). The reference buffer 327 can output the copy 359 of the reference clock signal to a second circuit (not illustrated in FIG. 3B). The first and second circuits can be the same or different circuits of a beamforming circuit. The second diplexer 368 can connect to the PCB channel 354 via package interconnects.

Figure 4:
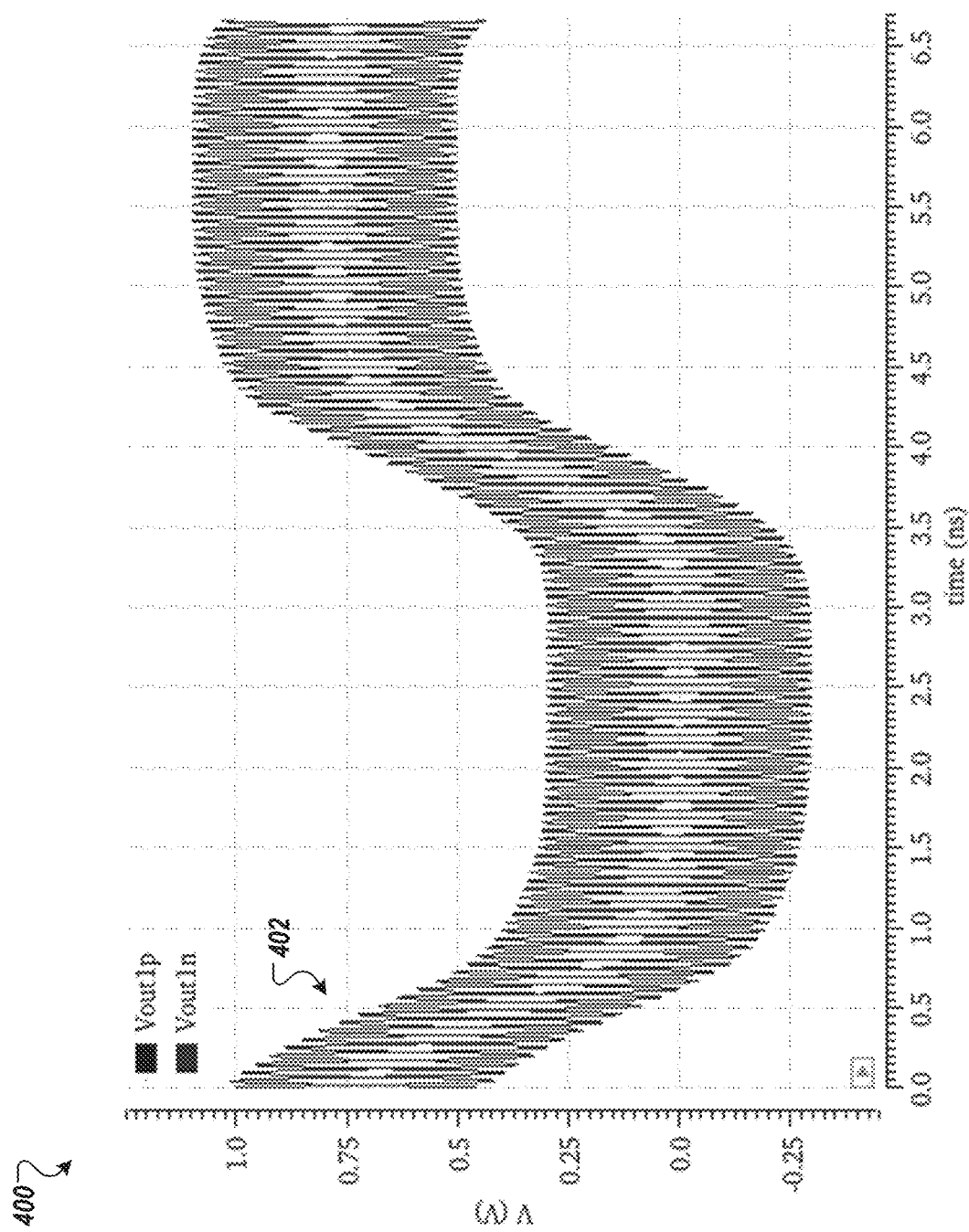
FIG. 4 is a signal diagram of a combined signal with a common-mode reference clock signal and a differential-mode local oscillator (LO) signal measured at an output coupled to a PCB channel, according to at least one embodiment.

By combining a lower frequency reference clock signal with a higher frequency LO signal at the output of the first diplexer, the combined signal 355 can include the common-mode reference clock signal and the differential-mode LO signal, as illustrated in FIG. 4.

FIG. 4 is a signal diagram 400 of a combined signal 402 with a common-mode reference clock signal and a differential-mode LO signal measured at an output 374 coupled to a PCB channel 354, according to at least one embodiment. The combined signal 402 can represent the combined signal 355 measured at the output 374 in FIG. 3B. As illustrated in the signal diagram 400, the combined signal 402 is a differential signal. The differential signal is represented as two voltage signals, a first voltage signal at a first terminal (Vout1$p$) and a second voltage signal at a second terminal (Vout1$n$) of the first output 375. The first voltage signal is a periodic signal at a first frequency (e.g., 10 GHz LO signal). The second voltage signal is a periodic signal at the first frequency. The first and second voltages vary approximately 0.5 volts as a differential signal. The combined signal 402 also has a common-mode reference signal at a lower frequency (e.g., 150 MHz). The lower frequency can be seen as a slower shift in the differential signal in a slower periodic fashion. For example, at a first time (t=0), the combined signal 402 is between approximately 0.5 volts and 1.0 volts, whereas, because of the common-mode reference signal being combined with the differential LO signal, the combined signal 402 at a second time (t=2.25 ns) is between approximately −0.25 volts and +0.25 volts. Then, at a third time (t=5.5 ns), the combined signal 402 is between approximately 0.5 volts and 1.0 volts.

Figure 5:
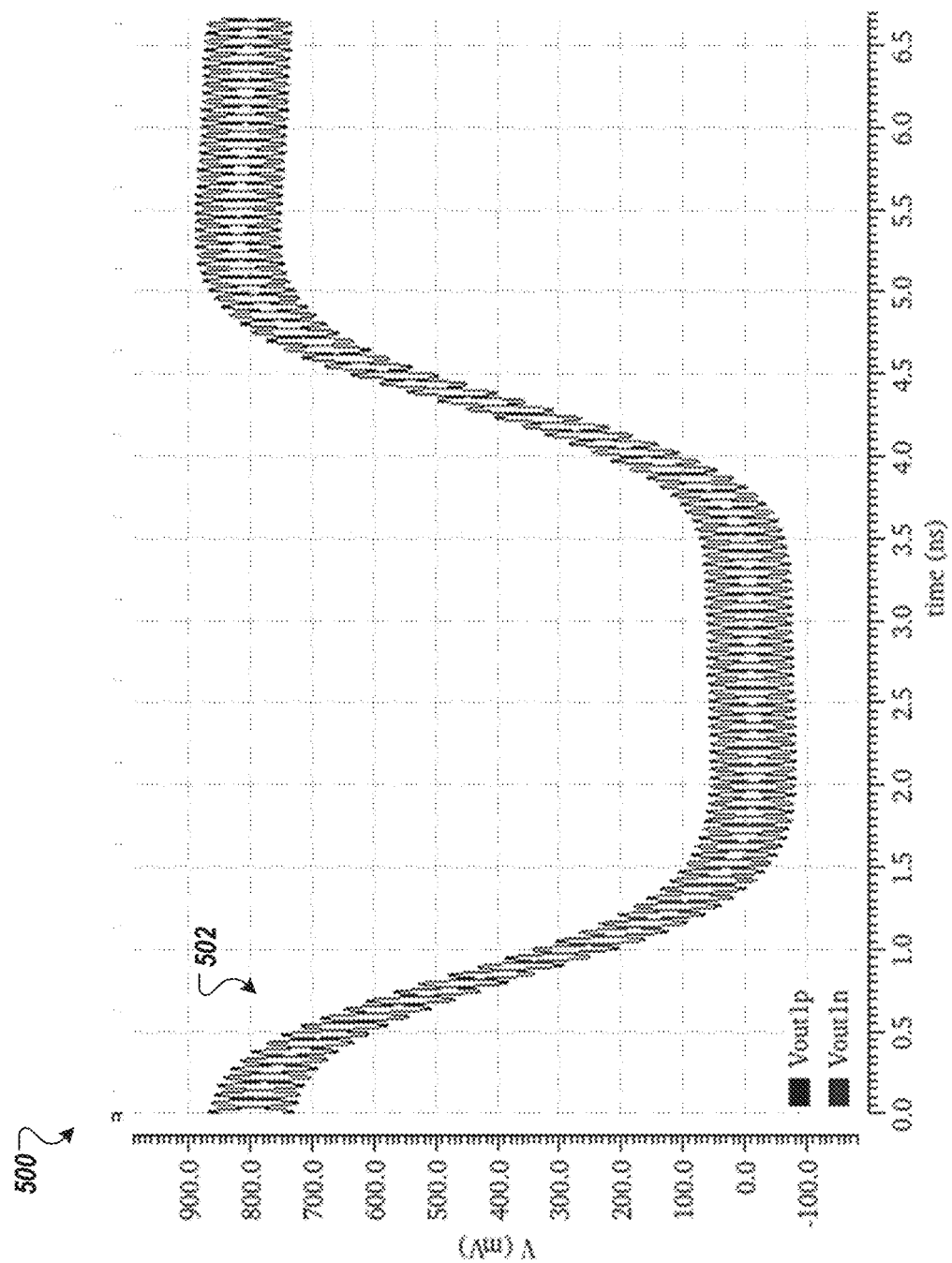
FIG. 5 is a signal diagram of a combined signal with a common-mode reference clock signal and a differential-mode LO signal measured at an input coupled to a PCB channel, according to at least one embodiment.

FIG. 5 is a signal diagram 500 of a combined signal 502 with a common-mode reference clock signal and a differential-mode LO signal measured at an input 376 coupled to a PCB channel 354, according to at least one embodiment. The combined signal 502 can represent the combined signal 355 measured at the input 376 in FIG. 3B. The combined signal 502 can represent the combined signal 355 after traveling through the PCB channel 354. As illustrated in the signal diagram 500, the higher frequency LO signal is attenuated in the combined signal 502, but the lower frequency reference signal remains in the combined signal 502. For example, at a first time (t=0), the combined signal 502 is between approximately 750 millivolts and 850 millivolts, whereas, because of the common-mode reference signal being combined with the differential LO signal, the combined signal 502 at a second time (t=2.25 ns) is between approximately −50 millivolts and +50 millivolts. Then, at a third time (t=5.5 ns), the combined signal 502 is between approximately 750 millivolts and 850 millivolts.

Figure 6A:
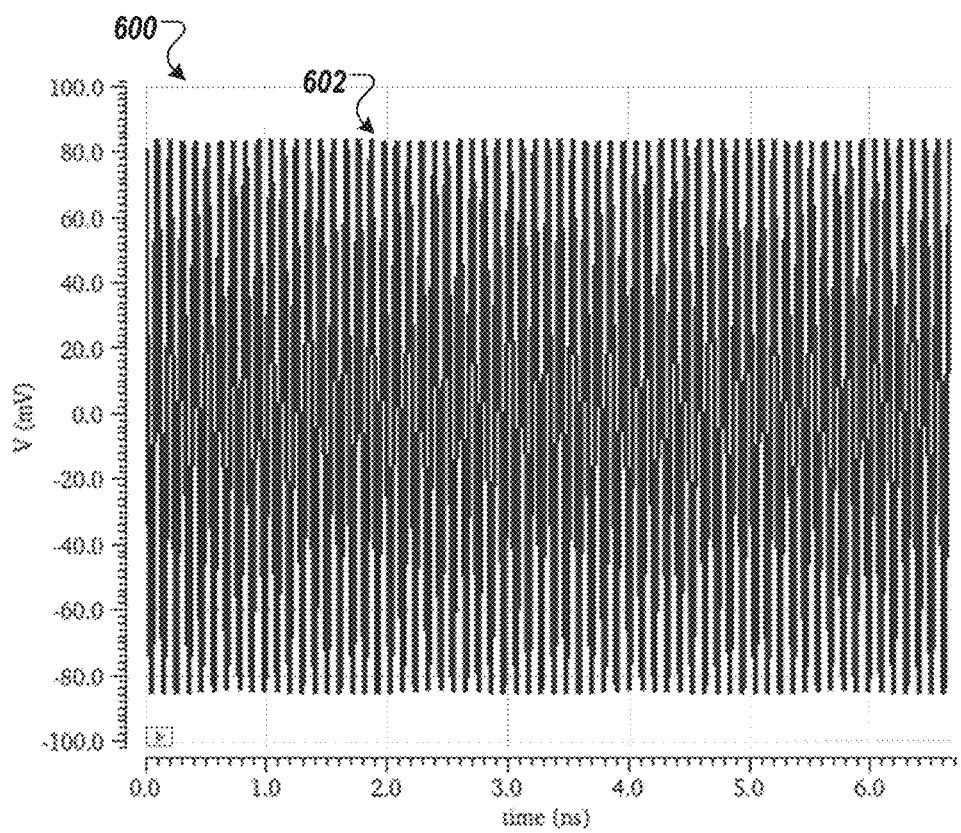
FIG. 6A is a time-domain graph of a LO signal, measured at an output of a second diplexer, after being split out from a combined signal, according to at least one embodiment.

FIG. 6A is a time-domain graph 600 of a LO signal 602, measured at an output 378 of a second diplexer, after being split out from a combined signal 355 of FIG. 3B, according to at least one embodiment. The LO signal 602 is a voltage signal measured at the output 378 of the second diplexer 368 after being uncombined from the reference clock signal. As illustrated in the time-domain graph 600, the peak-to-peak voltage (mVpp) of the LO signal 602 is approximately 160 m Vpp.

Figure 6B:
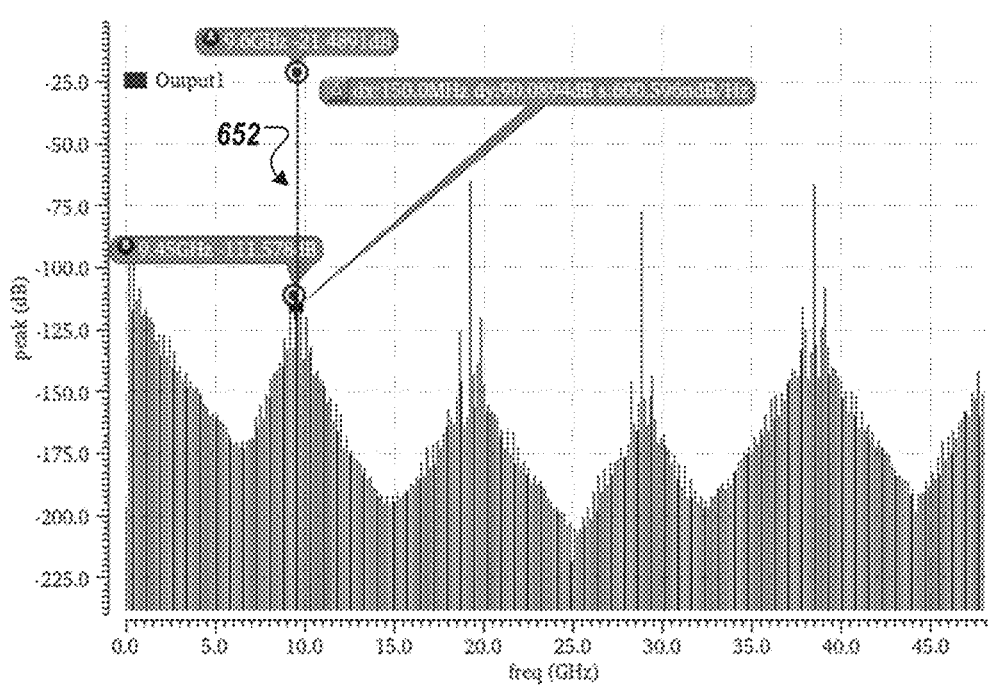
FIG. 6B is a frequency-domain graph of an isolation between a LO signal and a reference clock signal, measured at an output of a second diplexer, after being split out from a combined signal, according to at least one embodiment.

FIG. 6B is a frequency-domain graph 650 of an isolation 652 between a LO signal and a reference clock signal, measured at an output of a second diplexer, after being split out from a combined signal, according to at least one embodiment. The isolation 652 measured at the outputs of the second diplexer is approximately 90 dB without mismatch.

Figure 6C:
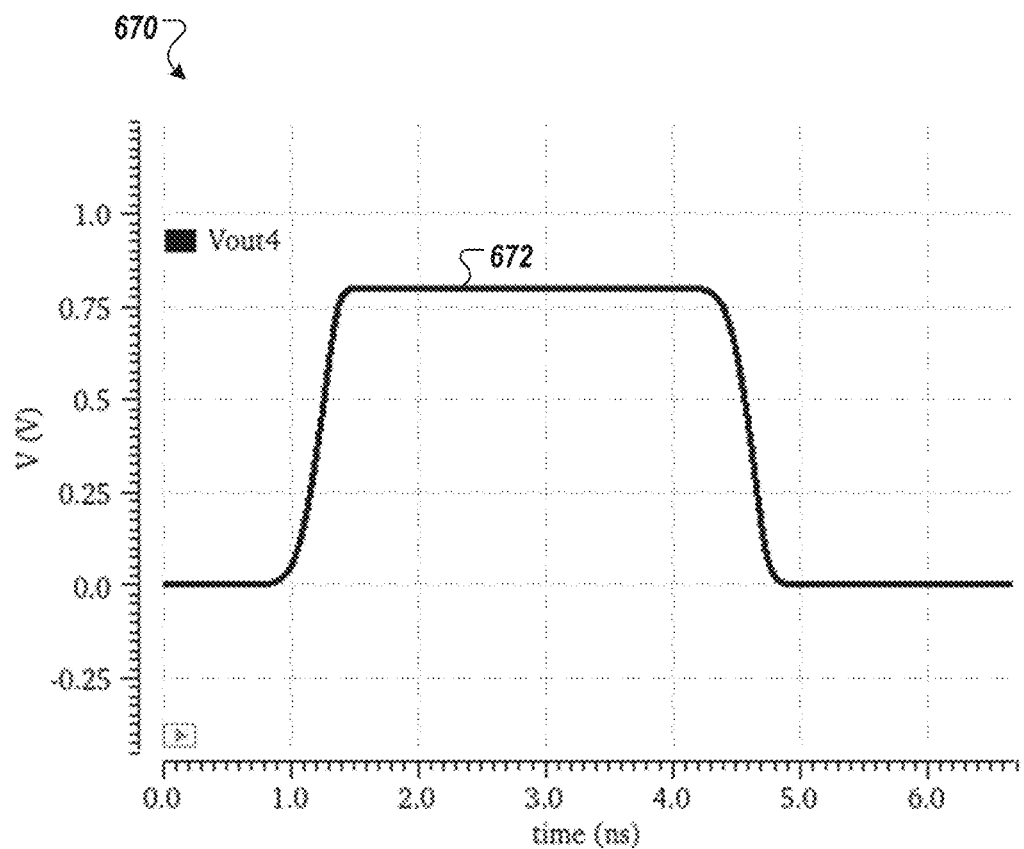
FIG. 6C is a time-domain graph of a reference clock signal, measured at an output of a reference buffer, according to at least one embodiment.
Figure 6D:
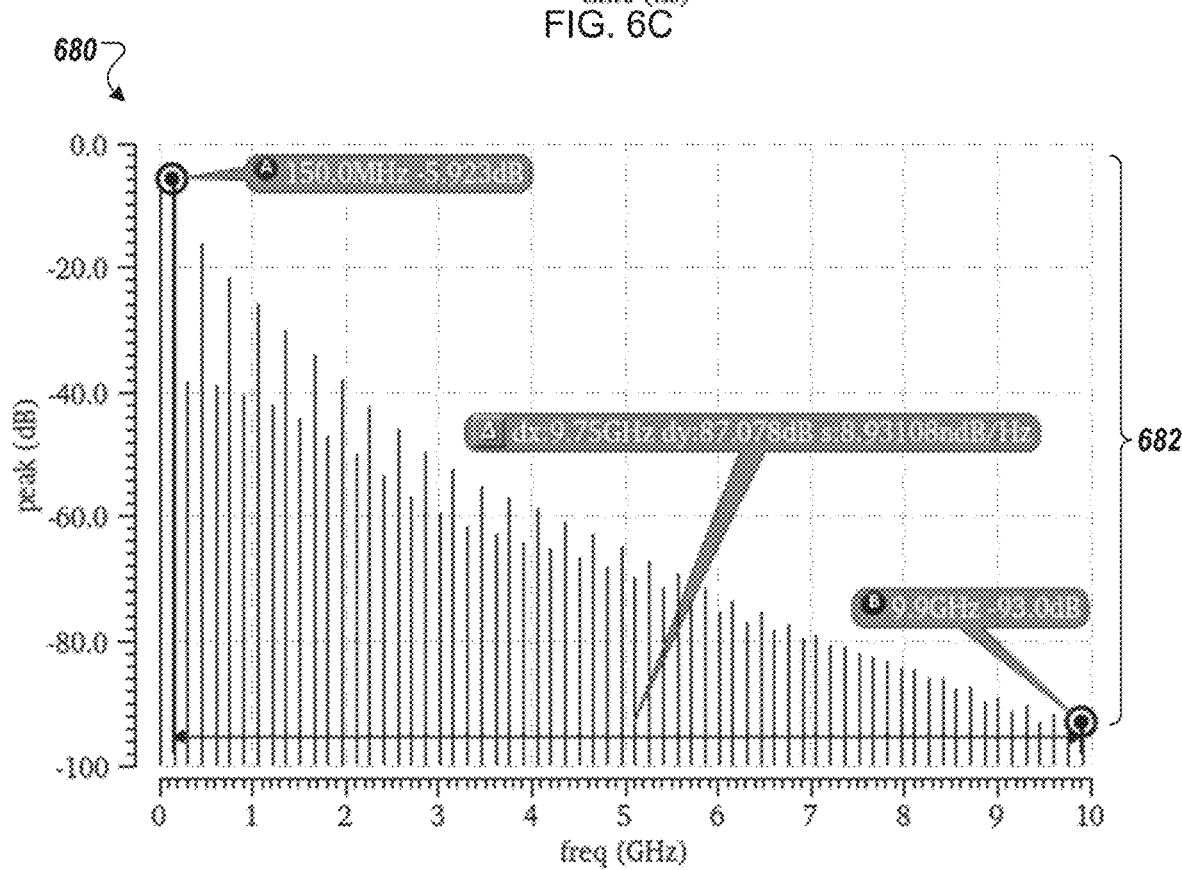
FIG. 6D is a frequency-domain graph of an isolation between a LO signal and a reference clock signal, measured at an output of the reference buffer, after a filter that attenuates the LO signal, according to at least one embodiment.

FIG. 6C is a time-domain graph 670 of a reference clock signal 672, measured at an output 380 of a reference buffer 372, according to at least one embodiment. The reference clock signal 672 is a voltage signal measured at the output 380 of the reference buffer 372 after being uncombined from the LO signal and after a resistor-capacitor (RC) filter that attenuates higher frequencies, such as illustrated in FIG. 6D. As illustrated in the time-domain graph 670, the reference clock signal 672 has a 0.8 Vpp.

FIG. 6D is a frequency-domain graph 680 of an isolation 682 between a LO signal and a reference clock signal, measured at an output of the reference buffer, after a filter that attenuates the LO signal, according to at least one embodiment. The isolation 682 measured at the output of the reference buffer 372 is approximately 90 dB without mismatch.

As described herein, the common-mode and differential-mode help with isolation between the two signals. A fairly large frequency separation can also achieve good isolation so that a simple on-pole filter (low-pass filter/high-pass filter) can be used for the diplexer. As described herein, on-chip transformers can be used for sharing PCB lines between reference clock signals and LO signals, relaxing the PCB routing complexity and costs.

Figure 7:
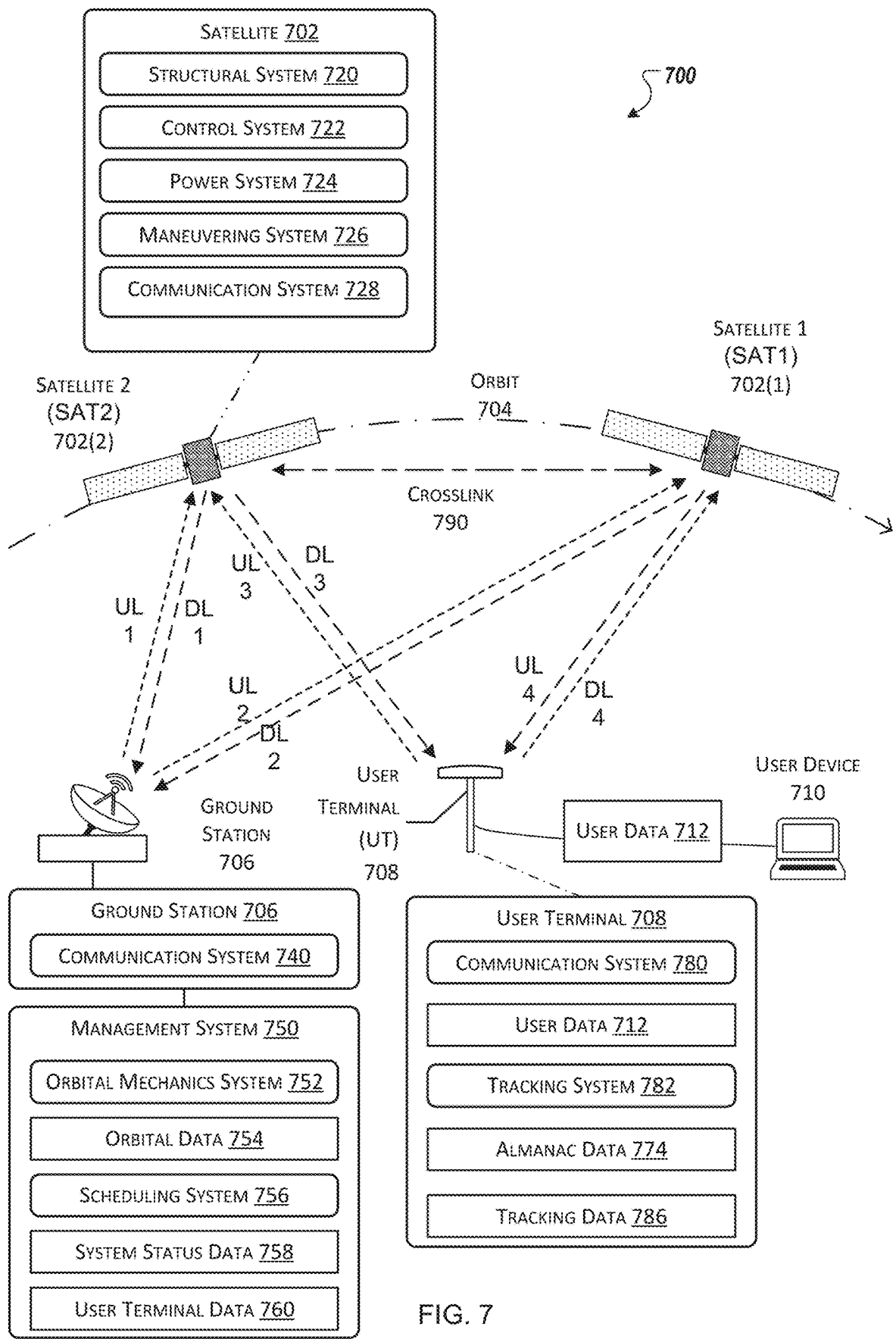
FIG. 7 illustrates a portion of a communication system that includes two satellites of a constellation of satellites, each satellite being in orbit, according to embodiments of the present disclosure.

FIG. 7 illustrates a portion of a communication system 700 that includes two satellites of a constellation of satellites 702(1), 702(2), . . . , 702(S), each satellite 702 being in orbit 704 according to embodiments of the present disclosure. The communication system 700 shown here comprises a plurality (or "constellation") of satellites 702(1), 702(2), . . . , 702(S), each satellite 702 being in orbit 704. Any of the satellites 702 can include the communication system described in the panel 100 of FIGS. 1A-1B, the panel 250 of FIG. 2B, communication system 300 of FIG. 3A, or communication system 350 of FIG. 3B. Also shown is a ground station 706, user terminal (UT) 708, and a user device 710. The communication systems described herein can be used in ground station 706, UT 708, or the like. It should also be noted that the communication system described herein can be used in other electronic devices where signals can share routing lines in a similar manner described herein.

The constellation may comprise hundreds or thousands of satellites 702, in various orbits 704. For example, one or more of these satellites 702 may be in non-geosynchronous orbits (NGOs) in which they are in constant motion with respect to the Earth. For example, the orbit 704 is a low earth orbit (LEO). In this illustration, orbit 704 is depicted with an arc pointed to the right. A first satellite (SAT1) 702(1) is leading (ahead of) a second satellite (SAT2) 702(2) in the orbit 704.

The satellite 702 may comprise a structural system 720, a control system 722, a power system 724, a maneuvering system 726, and a communication system 728 described herein. In other implementations, some systems may be omitted or other systems added. One or more of these systems may be communicatively coupled with one another in various combinations.

The structural system 720 comprises one or more structural elements to support operation of the satellite 702. For example, the structural system 720 may include trusses, struts, panels, and so forth. The components of other systems may be affixed to, or housed by, the structural system 720. For example, the structural system 720 may provide mechanical mounting and support for solar panels in the power system 724. The structural system 720 may also provide for thermal control to maintain components of the satellite 702 within operational temperature ranges. For example, the structural system 720 may include louvers, heat sinks, radiators, and so forth.

The control system 722 provides various services, such as operating the onboard systems, resource management, providing telemetry, processing commands, and so forth. For example, the control system 722 may direct operation of the communication system 728.

The power system 724 provides electrical power for operation of the components onboard the satellite 702. The power system 724 may include components to generate electrical energy. For example, the power system 724 may comprise one or more photovoltaic cells, thermoelectric devices, fuel cells, and so forth. The power system 724 may include components to store electrical energy. For example, the power system 724 may comprise one or more batteries, fuel cells, and so forth.

The maneuvering system 726 maintains the satellite 702 in one or more of a specified orientation or orbit 704. For example, the maneuvering system 726 may stabilize the satellite 702 with respect to one or more axis. In another example, the maneuvering system 726 may move the satellite 702 to a specified orbit 704. The maneuvering system 726 may include one or more computing devices, sensors, thrusters, momentum wheels, solar sails, drag devices, and so forth. For example, the sensors of the maneuvering system 726 may include one or more global navigation satellite system (GNSS) receivers, such as global positioning system (GPS) receivers, to provide information about the position and orientation of the satellite 702 relative to Earth. In another example, the sensors of the maneuvering system 726 may include one or more star trackers, horizon detectors, and so forth. The thrusters may include, but are not limited to, cold gas thrusters, hypergolic thrusters, solid-fuel thrusters, ion thrusters, arcjet thrusters, electrothermal thrusters, and so forth.

The communication system 728 provides communication with one or more other devices, such as other satellites 702, ground stations 706, user terminals 708, and so forth. The communication system 728 may include one or more modems, digital signal processors, power amplifiers, antennas (including at least one antenna that implements multiple antenna elements, such as a phased array antenna, and including an embedded calibration antenna, such as the calibration antenna 704 as described herein), processors, memories, storage devices, communications peripherals, interface buses, and so forth. Such components support communications with other satellites 702, ground stations 706, user terminals 708, and so forth using radio frequencies within a desired frequency spectrum. The communications may involve multiplexing, encoding, and compressing data to be transmitted, modulating the data to a desired radio frequency, and amplifying it for transmission. The communications may also involve demodulating received signals and performing any necessary de-multiplexing, decoding, decompressing, error correction, and formatting the signals. Data decoded by the communication system 728 may be output to other systems, such as to the control system 722, for further processing. Output from a system, such as the control system 722, may be provided to the communication system 728 for transmission.

One or more ground stations 706 are in communication with one or more satellites 702. The ground stations 706 may pass data between the satellites 702, a management system 750, networks such as the Internet, and so forth. The ground stations 706 may be emplaced on land, on vehicles, at sea, and so forth. Each ground station 706 may comprise a communication system 740. Each ground station 706 may use the communication system 740 to establish communication with one or more satellites 702, other ground stations 706, and so forth. The ground station 706 may also be connected to one or more communication networks. For example, the ground station 706 may connect to a terrestrial fiber optic communication network. The ground station 706 may act as a network gateway, passing user data 712 or other data between the one or more communication networks and the satellites 702. Such data may be processed by the ground station 706 and communicated via the communication system 740. The communication system 740 of a ground station may include components similar to those of the communication system 728 of a satellite 702 and may perform similar communication functionalities. For example, the communication system 740 may include one or more modems, digital signal processors, power amplifiers, antennas (including at least one antenna that implements multiple antenna elements, such as a phased array antenna), processors, memories, storage devices, communications peripherals, interface buses, and so forth.

The ground stations 706 are in communication with a management system 750. The management system 750 is also in communication, via the ground stations 706, with the satellites 702 and the UTs 708. The management system 750 coordinates operation of the satellites 702, ground stations 706, UTs 708, and other resources of the communication system 700. The management system 750 may comprise one or more of an orbital mechanics system 752 or a scheduling system 756. In some embodiments, the scheduling system 756 can operate in conjunction with an HD controller.

The orbital mechanics system 752 determines orbital data 754 that is indicative of a state of a particular satellite 702 at a specified time. In one implementation, the orbital mechanics system 752 may use orbital elements that represent characteristics of the orbit 704 of the satellites 702 in the constellation to determine the orbital data 754 that predicts location, velocity, and so forth of particular satellites 702 at particular times or time intervals. For example, the orbital mechanics system 752 may use data obtained from actual observations from tracking stations, data from the satellites 702, scheduled maneuvers, and so forth to determine the orbital elements. The orbital mechanics system 752 may also consider other data, such as space weather, collision mitigation, orbital elements of known debris, and so forth.

The scheduling system 756 schedules resources to provide communication to the UTs 708. For example, the scheduling system 756 may determine handover data that indicates when communication is to be transferred from the first satellite 702(1) to the second satellite 702(2). Continuing the example, the scheduling system 756 may also specify communication parameters such as frequency, timeslot, and so forth. During operation, the scheduling system 756 may use information such as the orbital data 754, system status data 758, user terminal data 760, and so forth.

The system status data 758 may comprise information such as which UTs 708 are currently transferring data, satellite availability, current satellites 702 in use by respective UTs 708, capacity available at particular ground stations 706, and so forth. For example, the satellite availability may comprise information indicative of satellites 702 that are available to provide communication service or those satellites 702 that are unavailable for communication service. Continuing the example, a satellite 702 may be unavailable due to malfunction, previous tasking, maneuvering, and so forth. The system status data 758 may be indicative of past status, predictions of future status, and so forth. For example, the system status data 758 may include information such as projected data traffic for a specified interval of time based on previous transfers of user data 712. In another example, the system status data 758 may be indicative of future status, such as a satellite 702 being unavailable to provide communication service due to scheduled maneuvering, scheduled maintenance, scheduled decommissioning, and so forth.

The user terminal data 760 may comprise information such as a location of a particular UT 708. The user terminal data 760 may also include other information such as a priority assigned to user data 712 associated with that UT 708, information about the communication capabilities of that particular UT 708, and so forth. For example, a particular UT 708 in use by a business may be assigned a higher priority relative to a UT 708 operated in a residential setting. Over time, different versions of UTs 708 may be deployed, having different communication capabilities such as being able to operate at particular frequencies, supporting different signal encoding schemes, having different antenna configurations, and so forth.

The UT 708 includes a communication system 780 to establish communication with one or more satellites 702. The communication system 780 of the UT 708 may include components similar to those of the communication system 728 of a satellite 702 and may perform similar communication functionalities. For example, the communication system 780 may include one or more modems, digital signal processors, power amplifiers, antennas (including at least one antenna that implements multiple antenna elements, such as a phased array antenna), processors, memories, storage devices, communications peripherals, interface buses, and so forth. The UT 708 passes user data 712 between the constellation of satellites 702 and the user device 710. The user data 712 includes data originated by the user device 710 or addressed to the user device 710. The UT 708 may be fixed or in motion. For example, the UT 708 may be used at a residence, or on a vehicle such as a car, boat, aerostat, drone, airplane, and so forth.

The UT 708 includes a tracking system 782. The tracking system 782 uses almanac data 784 to determine tracking data 786. The almanac data 784 provides information indicative of orbital elements of the orbit 704 of one or more satellites 702. For example, the almanac data 784 may comprise orbital elements such as "two-line element" data for the satellites 702 in the constellation that are broadcast or otherwise sent to the UTs 708 using the communication system 780.

The tracking system 782 may use the current location of the UT 708 and the almanac data 784 to determine the tracking data 786 for the satellite 702. For example, based on the current location of the UT 708 and the predicted position and movement of the satellites 702, the tracking system 782 is able to calculate the tracking data 786. The tracking data 786 may include information indicative of azimuth, elevation, distance to the second satellite, time of flight correction, or other information at a specified time. The determination of the tracking data 786 may be ongoing. For example, the first UT 708 may determine tracking data 786 every 700 ms, every second, every five seconds, or at other intervals.

With regard to FIG. 7, an uplink is a communication link which allows data to be sent to a satellite 702 from a ground station 706, UT 708, or a device other than another satellite 702. Uplinks are designated as UL1, UL2, UL3, and so forth. For example, UL1 is a first uplink from the ground station 706 to the second satellite 702(2). In comparison, a downlink is a communication link which allows data to be sent from the satellite 702 to a ground station 706, UT 708, or a device other than another satellite 702. For example, DL1 is a first downlink from the second satellite 702(2) to the ground station 706. The satellites 702 may also be in communication with one another. For example, a crosslink 790 provides for communication between satellites 702 in the constellation.

The satellite 702, the ground station 706, the user terminal 708, the user device 710, the management system 750, or other systems described herein may include one or more computing devices or computer systems comprising one or more hardware processors, computer-readable storage media, and so forth. For example, the hardware processors may include application-specific integrated circuits (ASICs), field-programmable gate arrays (FPGAs), microcontrollers, digital signal processors (DSPs), and so forth. The computer-readable storage media can include system memory, which may correspond to any combination of volatile and/or non-volatile memory or storage technologies. The system memory can store information that provides an operating system, various program modules, program data, and/or other software or firmware components. In one embodiment, the system memory stores instructions of methods to control operation of the electronic device. The electronic device performs functions by using the processor(s) to execute instructions provided by the system memory.

Embodiments may be provided as a software program or computer program including a non-transitory computer-readable storage medium having stored thereon instructions (in compressed or uncompressed form) that may be used to program a computer (or other electronic devices) to perform the processes or methods described herein. The computer-readable storage medium may be one or more of an electronic storage medium, a magnetic storage medium, an optical storage medium, a quantum storage medium, and so forth. For example, the computer-readable storage medium may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Figure 8:
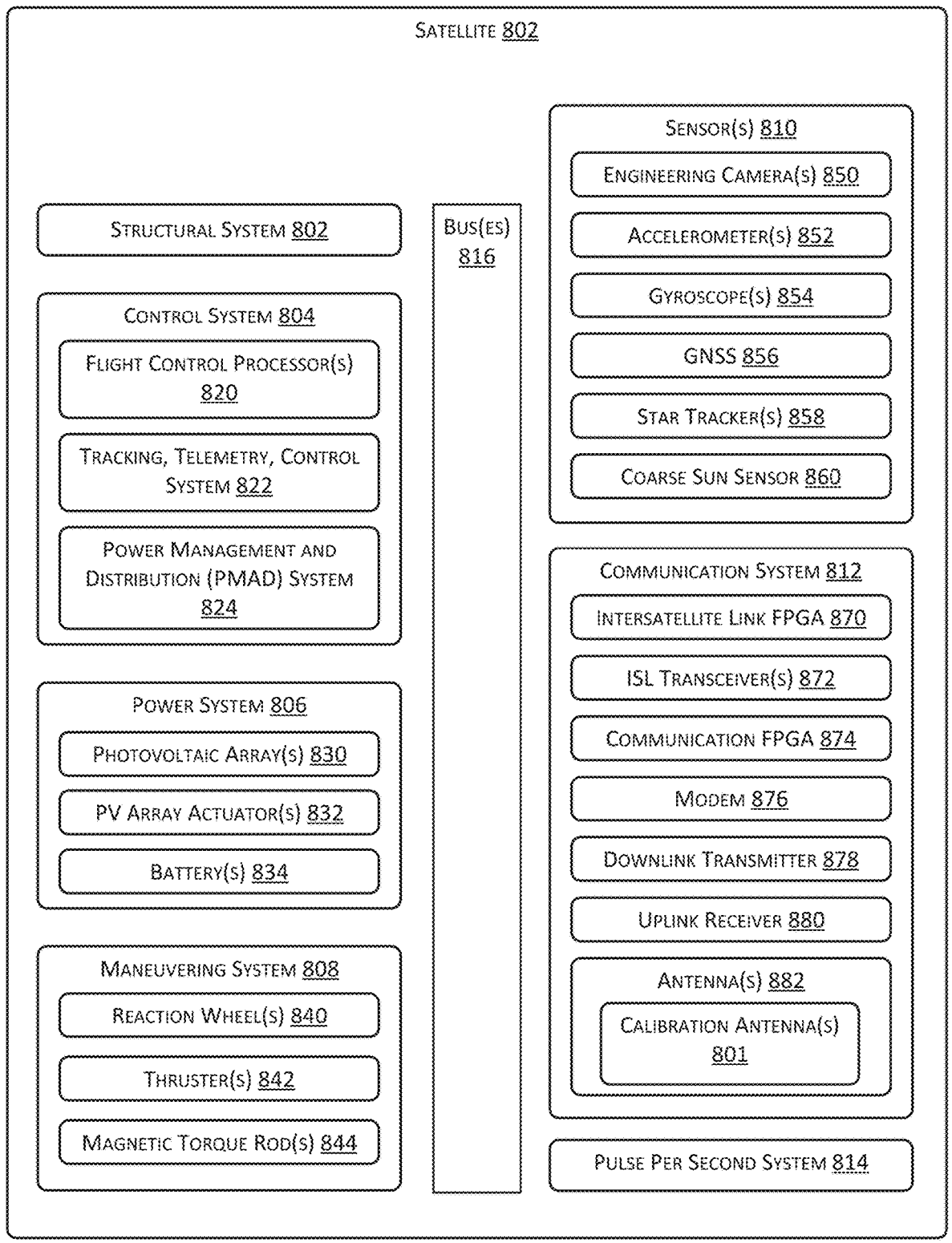
FIG. 8 is a functional block diagram of some systems associated with the satellite, according to some implementations.

FIG. 8 is a functional block diagram of some systems associated with the satellite 702, according to some implementations. The satellite 702 may comprise a structural system 802, a control system 804, a power system 806, a maneuvering system 808, one or more sensors 810, and a communication system 812. A pulse per second (PPS) system 814 may be used to provide a timing reference to the systems onboard the satellite 702. One or more busses 816 may be used to transfer data between the systems onboard the satellite 702. In some implementations, redundant busses 816 may be provided. The busses 816 may include, but are not limited to, data busses such as Controller Area Network Flexible Data Rate (CAN FD), Ethernet, Serial Peripheral Interface (SPI), and so forth. In some implementations, the busses 816 may carry other signals. For example, a radio frequency bus may comprise a coaxial cable, waveguides, and so forth to transfer radio signals from one part of the satellite 702 to another. In other implementations, some systems may be omitted or other systems added. One or more of these systems may be communicatively coupled with one another in various combinations.

The structural system 802 comprises one or more structural elements to support operation of the satellite 702. For example, the structural system 802 may include trusses, struts, panels, and so forth. The components of other systems may be affixed to, or housed by, the structural system 802. For example, the structural system 802 may provide mechanical mounting and support for solar panels in the power system 806. The structural system 802 may also provide for thermal control to maintain components of the satellite 702 within operational temperature ranges. For example, the structural system 802 may include louvers, heat sinks, radiators, and so forth.

The control system 804 provides various services, such as operating the onboard systems, resource management, providing telemetry, processing commands, and so forth. For example, the control system 804 may direct operation of the communication system 812. The control system 804 may include one or more flight control processors 820. The flight control processors 820 may comprise one or more processors, FPGAs, and so forth. A tracking, telemetry, and control (TTC) system 822 may include one or more processors, radios, and so forth. For example, the TTC system 822 may comprise a dedicated radio transmitter and receiver to receive commands from a ground station 706, send telemetry to the ground station 706, and so forth. A power management and distribution (PMAD) system 824 may direct operation of the power system 806, control distribution of power to the systems of the satellite 702, control battery 834 charging, and so forth.

The power system 806 provides electrical power for operation of the components onboard the satellite 702. The power system 806 may include components to generate electrical energy. For example, the power system 806 may comprise one or more photovoltaic arrays 830 comprising a plurality of photovoltaic cells, thermoelectric devices, fuel cells, and so forth. One or more PV array actuators 832 may be used to change the orientation of the photovoltaic array(s) 830 relative to the satellite 702. For example, the PV array actuator 832 may comprise a motor. The power system 806 may include components to store electrical energy. For example, the power system 806 may comprise one or more batteries 834, fuel cells, and so forth.

The maneuvering system 808 maintains the satellite 702 in one or more of a specified orientation or orbit 704. For example, the maneuvering system 808 may stabilize the satellite 702 with respect to one or more axes. In another example, the maneuvering system 808 may move the satellite 702 to a specified orbit 704. The maneuvering system 808 may include one or more of reaction wheel(s) 840, thrusters 842, magnetic torque rods 844, solar sails, drag devices, and so forth. The thrusters 842 may include, but are not limited to, cold gas thrusters, hypergolic thrusters, solid-fuel thrusters, ion thrusters, arcjet thrusters, electrothermal thrusters, and so forth. During operation, the thrusters may expend propellant. For example, an electrothermal thruster may use water as the propellant, using electrical power obtained from the power system 806 to expel the water and produce thrust. During operation, the maneuvering system 808 may use data obtained from one or more of the sensors 810.

The satellite 702 includes one or more sensors 810. The sensors 810 may include one or more engineering cameras 850. For example, an engineering camera 850 may be mounted on the satellite 702 to provide images of at least a portion of the photovoltaic array 830. Accelerometers 852 provide information about the acceleration of the satellite 702 along one or more axes. Gyroscopes 854 provide information about the rotation of the satellite 702 with respect to one or more axes. The sensors 810 may include a global navigation satellite system (GNSS) 856 receiver, such as a Global Positioning System (GPS) receiver, to provide information about the position of the satellite 702 relative to Earth. In some implementations, the GNSS 856 may also provide information indicative of velocity, orientation, and so forth. One or more star trackers 858 may be used to determine an orientation of the satellite 702. A coarse sun sensor 860 may be used to detect the sun, provide information on the relative position of the sun with respect to the satellite 702, and so forth. The satellite 702 may include other sensors 810 as well. For example, the satellite 702 may include a horizon detector, radar, lidar, and so forth.

The communication system 812 provides communication with one or more other devices, such as other satellites 702, ground stations 706, user terminals 708, and so forth. The communication system 812 may include one or more modems 876, digital signal processors, power amplifiers, antennas 882 (including at least one antenna that implements multiple antenna elements, such as a phased array antenna such as the antenna elements 108 of FIGS. 1A-1B), processors, memories, storage devices, communications peripherals, interface buses, and so forth. Such components support communications with other satellites 702, ground stations 706, user terminals 708, and so forth using radio frequencies within a desired frequency spectrum. The communications may involve multiplexing, encoding, and compressing data to be transmitted, modulating the data to a desired radio frequency, and amplifying it for transmission. The communications may also involve demodulating received signals and performing any necessary de-multiplexing, decoding, decompressing, error correction, and formatting the signals. Data decoded by the communication system 812 may be output to other systems, such as to the control system 804, for further processing. Output from a system, such as the control system 804, may be provided to the communication system 812 for transmission.

The communication system 812 may include hardware to support the crosslink 709 (e.g., an intersatellite link). For example, an intersatellite link FPGA 870 may be used to modulate data that is sent and received by an intersatellite link (ISL) transceiver 872 to send data between satellites 702. The ISL transceiver 872 may operate using radio frequencies, optical frequencies, and so forth.

A communication FPGA 874 may be used to facilitate communication between the satellite 702 and the ground stations 706, UTs 708, and so forth. For example, the communication FPGA 874 may direct operation of a modem 876 to modulate signals sent using a downlink transmitter 878 and demodulate signals received using an uplink receiver 880. The satellite 702 may include one or more antennas 882. For example, one or more parabolic antennas may be used to provide communication between the satellite 702 and one or more ground stations 706. In another example, a phased array antenna may be used to provide communication between the satellite 702 and the UTs 708.

Figure 9:
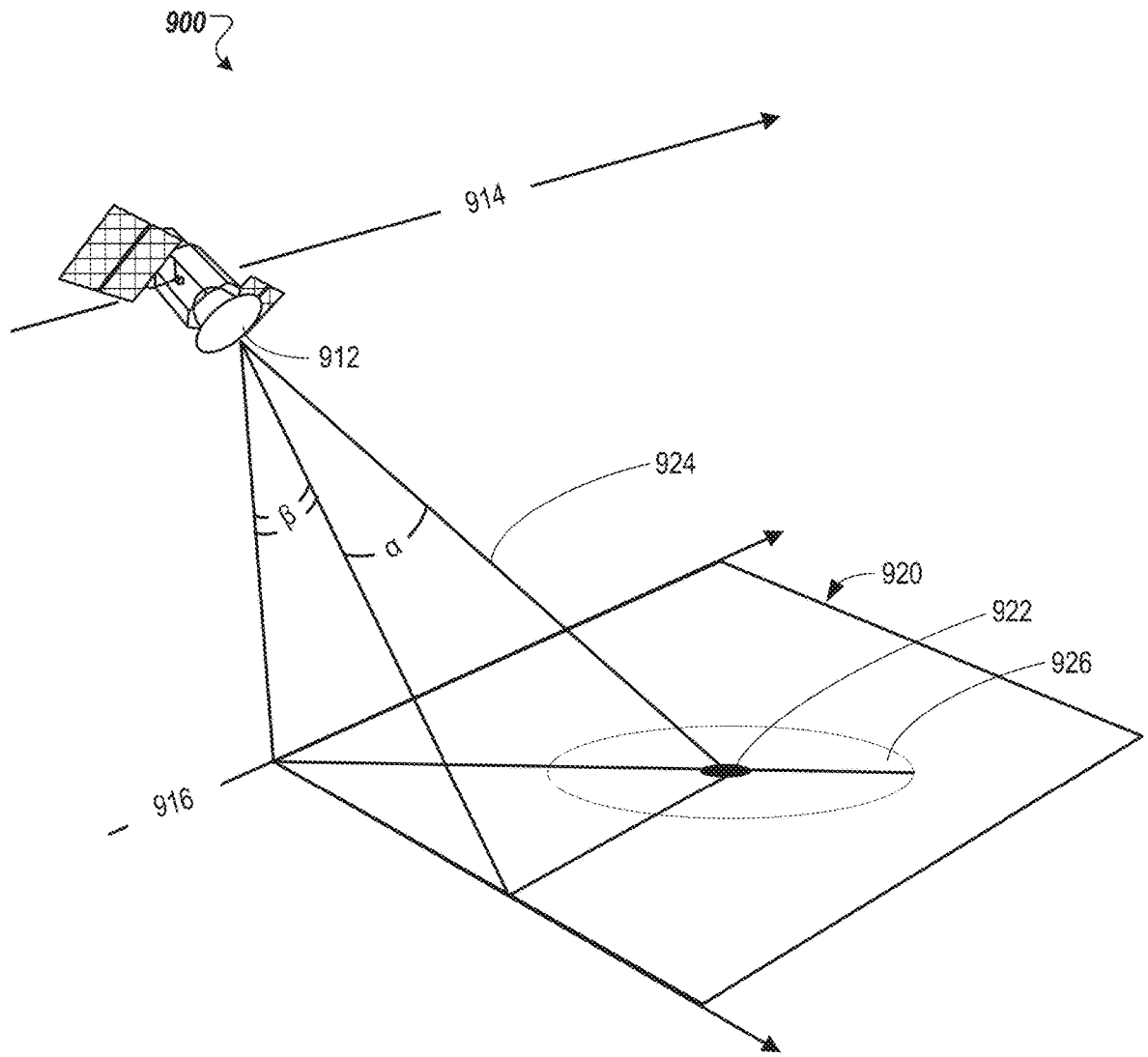
FIG. 9 illustrates a satellite including an antenna system that is steerable, according to embodiments of the present disclosure.

FIG. 9 illustrates the satellite 900 including an antenna system 912 that is steerable according to embodiments of the present disclosure. The satellite 900 can include can include any of the communication systems described herein, such as in connection with the panel 100 of FIGS. 1A-1B, the panel 250 of FIG. 2B, the communication system 300 of FIG. 3A, the communication system 350 of FIG. 3B, or the like. The antenna system 912 may include multiple antenna elements that form an antenna and that can be mechanically or electrically steered individually, collectively, or a combination thereof. In an example, the antenna is a phased array antenna.

In orbit 704, the satellite 900 follows a path 914, the projection of which onto the surface of the Earth forms a ground path 916. In the example illustrated in FIG. 9, the ground path 916 and a projected axis extending orthogonally from the ground path 916 at the position of the satellite 900, together define a region 920 of the surface of the Earth. In this example, the satellite 900 is capable of establishing uplink and downlink communications with one or more of ground stations, user terminals, or other devices within the region 920. In some embodiments, the region 920 may be located in a different relative position to the ground path 916 and the position of the satellite 900. For example, the region 920 may describe a region of the surface of the Earth directly below the satellite 900. Furthermore, embodiments may include communications between the satellite 900, an airborne communications system, and so forth.

As shown in FIG. 9, a communication target 922 (e.g., a ground station, a user terminal, or a CT (such as an HD CT)) is located within the region 920. The satellite 900 controls the antenna system 912 to steer transmission and reception of communications signals to selectively communicate with the communication target 922. For example, in a downlink transmission from the satellite 900 to the communication target 922, a signal beam 924 emitted by the antenna system 912 is steerable within an area 926 of the region 920. In some implementations, the signal beam 924 may include multiple sub-beams. The extents of the area 926 define an angular range within which the signal beam 924 is steerable, where the direction of the signal beam 924 is described by a beam angle "α" relative to a surface normal vector of the antenna system 912. In two-dimensional phased array antennas, the signal beam 924 is steerable in two dimensions, described in FIG. 9 by a second angle "β" orthogonal to the beam angle α. In this way, the area 926 is a two-dimensional area within the region 920, rather than a linear track at a fixed angle determined by the orientation of the antenna system 912 relative to the ground path 916.

In FIG. 9, as the satellite 900 follows the path 914, the area 926 tracks along the surface of the Earth. In this way, the communication target 922, which is shown centered in the area 926 for clarity, is within the angular range of the antenna system 912 for a period of time. During that time, signals communicated between the satellite 900 and the communication target 922 are subject to bandwidth constraints, including but not limited to signal strength and calibration of the signal beam 924. In an example, for phased array antenna systems, the signal beam 924 is generated by an array of mutually coupled antenna elements, wherein constructive and destructive interference produce a directional beam. Among other factors, phase drift, amplitude drift (e.g., of a transmitted signal in a transmitter array), and so forth affect the interference properties and thus the resultant directional beam or sub-beam.

Figure 10:
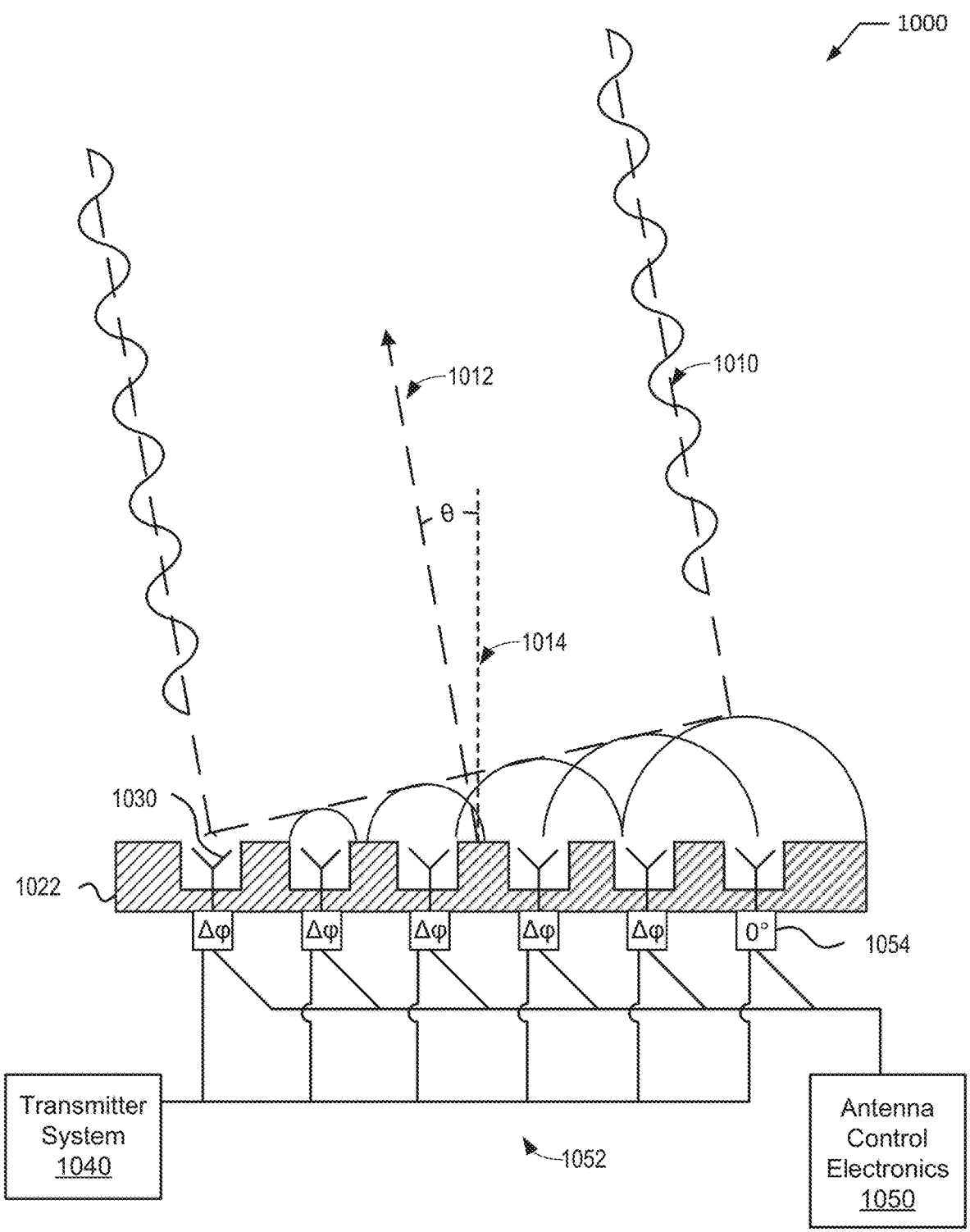
FIG. 10 illustrates a simplified schematic of an antenna, according to embodiments of the present disclosure.

FIG. 10 illustrates a simplified schematic of an antenna 1000, according to embodiments of the present disclosure. The antenna 1000 may be a component of the antenna system 912 of FIG. 9. As illustrated, the antenna 1000 is a phased array antenna that includes multiple antenna elements 1030 (e.g., antenna elements 108 in FIGS. 1A-1B). Interference between the antenna elements 1030 forms a directional radiation pattern in both transmitter and receiver arrays forming a beam 1010 (beam extents shown as dashed lines). The beam 1010 is a portion of a larger transmission pattern (not shown) that extends beyond the immediate vicinity of the antenna 1000. The beam 1010 is directed along a beam vector 1012, described by an angle "θ" relative to an axis 1014 normal to a surface of the antenna 1000. As described below, the beam 1010 is one or more of steerable or shapeable through control of operating parameters including, but not limited to, a phase and an amplitude of each antenna element 1030.

In FIG. 10, the antenna 1000 includes, within a transmitter section 1022, the antenna elements 1030, which may include, but are not limited to, omnidirectional transmitter antennas coupled to a transmitter system 1040, such as the downlink transmitter 878. The transmitter system 1040 provides a signal, such as a downlink signal to be transmitted to a ground station on the surface. The downlink signal is provided to each antenna element 1030 as a time-varying signal that may include several multiplexed signals. To steer the beam 1010 relative to the axis 1014, the phased array antenna system includes antenna control electronics 1050 controlling a radio frequency (RF) feeding network 1052, including multiple signal conditioning components 1054 interposed between the antenna elements 1030 and the transmitter system 1040. The signal conditioning components 1054 introduce one or more of a phase modulation or an amplitude modulation (e.g., by phase shifters), as denoted by "Δφ" in FIG. 10, to the signal sent to the antenna elements 1030. As shown in FIG. 10, introducing a progressive phase modulation produces interference in the individual transmission of each antenna element 1030 that generates the beam 1010.

The phase modulation imposed on each antenna element 1030 can differ and can be dependent on a spatial location of a communication target that determines an optimum beam vector (e.g., where the beam vector 1012 is found by one or more of maximizing signal intensity or connection strength). The optimum beam vector may change with time as the communication target 922 moves relative to the antenna 1000 (e.g., phased array antenna system).

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "sending," "receiving," "scheduling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMS, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A communication unit comprising:
   a plurality of antenna elements;
   a first beamforming circuit coupled to a first antenna element of the plurality of antenna elements; and
   a signal distribution circuit comprising:
      a first phase-locked loop (PLL) circuit that generates a local oscillator (LO) signal having a first frequency;
      a second PLL circuit that generates a reference clock signal having a second frequency that is lower than the first frequency;
      a first driver coupled to the first PLL circuit, wherein the first driver outputs the LO signal;
      a second driver coupled to the second PLL circuit, wherein the second driver outputs the reference clock signal; and
      a diplexer comprising input terminals coupled to the first driver, output terminals, and a center tap coupled to the second driver, wherein:
         the diplexer sends, via the output terminals, a combined signal over a first signal path between the signal distribution circuit and the first beamforming circuit, the combined signal comprises the LO signal and the reference clock signal.

2. The communication unit of claim 1, wherein the diplexer further comprises:
   a primary winding coupled between a first input terminal and a second input terminal of the input terminals; and
   a secondary winding coupled between a first output terminal and a second output terminal of the output terminals,
   wherein the center tap is coupled to a halfway point in the secondary winding.

3. The communication unit of claim 1, further comprising a second beamforming circuit coupled to a second antenna element of the plurality of antenna elements, wherein the signal distribution circuit further comprises:
   a third driver coupled to the first PLL circuit, wherein the third driver outputs a copy of the LO signal;
   a fourth driver coupled to the second PLL circuit, wherein the second driver outputs a copy of the reference clock signal; and
   a second diplexer coupled to the third driver and the fourth driver, wherein the second diplexer sends a copy of the combined signal over a second signal path between the signal distribution circuit and the second beamforming circuit.

4. A circuit comprising:
   a first signal generator that generates a first signal having a first frequency;
   a second signal generator that generates a second signal having a second frequency that is lower than the first frequency;
   a first driver coupled to the first signal generator, wherein the first driver outputs the first signal;
   a second driver coupled to the second signal generator, wherein the second driver outputs the second signal; and
   a first diplexer coupled to the first driver and the second driver, wherein the first diplexer sends a combined signal over a first signal path to a first beamforming circuit, wherein the combined signal comprises the first signal and the second signal.

5. The circuit of claim 4, wherein the first signal generator is a first phase-locked loop (PLL) circuit, and the second signal generator is a second PLL circuit.

6. The circuit of claim 4, wherein the first diplexer comprises:
   a first input terminal and a second input terminal;
   a first output terminal and a second output terminal;
   a primary winding coupled between the first input terminal and the second input terminal;
   a secondary winding coupled between the first output terminal and the second output terminal; and
   a center tap coupled to the secondary winding.

7. The circuit of claim 6, wherein:
   the primary winding comprises one or more turns;
   the secondary winding comprises one or more turns; and
   the center tap is coupled to the secondary winding at a halfway point of the secondary winding.

8. The circuit of claim 4, further comprising:
   a third driver coupled to the first signal generator, wherein the third driver outputs a copy of the first signal;
   a fourth driver coupled to the second signal generator, wherein the second driver outputs a copy of the second signal; and
   a second diplexer coupled to the third driver and the fourth driver, wherein the second diplexer sends a copy of the combined signal over a second signal path to a second beamforming circuit.

9. The circuit of claim 4, wherein the circuit is part of a modem and the modem is coupled to the first beamforming circuit via the first signal path.

10. The circuit of claim 4, wherein the first frequency is greater than the second frequency by at least one octave.

11. The circuit of claim 4, wherein the first driver is a differential driver, and wherein the second driver is an inverter.

12. A communication system comprising:
    a plurality of antenna elements;
    a set of beamforming circuits, each beamforming circuit being coupled to at least one of the plurality of antenna elements;
    a plurality of signal paths, each signal path being coupled to one of the beamforming circuits;

driver circuitry that outputs a first signal having a first frequency and a second signal having a second frequency that is lower than the first frequency; and diplexing circuitry coupled to the driver circuitry, wherein the diplexing circuitry:

generates a combined signal comprising the first signal and the second signal; and sends the combined signal to each of the set of beamforming circuits.

13. The communication system of claim 12, further comprising:

a first signal generator that generates the first signal; and a second signal generator that generates the second signal.

14. The communication system of claim 13, wherein the first signal generator is a first phase-locked loop (PLL) circuit, and the second signal generator is a second PLL circuit.

15. The communication system of claim 13, wherein:

the driver circuitry comprises:

a first driver coupled to the first signal generator, wherein the first driver outputs a first copy of the first signal;

a second driver coupled to the second signal generator, wherein the second driver outputs a first copy of the second signal;

a third driver coupled to the first signal generator, wherein the third driver outputs a second copy of the first signal;

a fourth driver coupled to the second signal generator, wherein the fourth driver outputs a second copy of the second signal; and the diplexing circuitry comprises:

a first diplexer coupled to the first driver and the second driver, wherein the first diplexer sends a first copy of the combined signal over a first signal path to a first beamforming circuit of the set of beamforming circuits; and a second diplexer coupled to the third driver and the fourth driver, wherein the second diplexer sends a second copy of the combined signal over a second signal path to a second beamforming circuit of the set of beamforming circuits.

16. The communication system of claim 15, wherein the first driver is a differential driver, and wherein the second driver is an inverter.

17. The communication system of claim 12, wherein the diplexing circuitry comprises a first diplexer comprising:

a first input terminal and a second input terminal;

a first output terminal and a second output terminal;

a primary winding coupled between the first input terminal and the second input terminal;

a secondary winding coupled between the first output terminal and the second output terminal; and a center tap coupled to the secondary winding.

18. The communication system of claim 17, wherein:

the primary winding comprises one or more turns;

the secondary winding comprises one or more turns; and the center tap is coupled to the secondary winding at a halfway point of the secondary winding.

19. The communication system of claim 12, further comprising:

second diplexing circuitry coupled to a second signal path to receive a second combined signal and generate, from the second combined signal, the first signal and the second signal; and buffer circuitry coupled to the second diplexing circuitry, wherein the buffer circuitry receives, from the second diplexing circuitry, the first signal and the second signal and outputs the first signal and the second signal to the driver circuitry.

20. The communication system of claim 12, further comprising:

second diplexing circuitry coupled to a signal path coupled to at least one of a signal distribution circuit or another beamforming circuit, wherein the second diplexing circuitry receives a second combined signal over the signal path and generates, from the second combined signal, the first signal and the second signal; and buffer circuitry coupled to the second diplexing circuitry, wherein the buffer circuitry receives, from the second diplexing circuitry, the first signal and the second signal.

* * * * *